(12) United States Patent
Wang et al.

(10) Patent No.: US 10,270,221 B1
(45) Date of Patent: Apr. 23, 2019

(54) OPTICAL DEVICE AND SYSTEM HAVING AN ARRAY OF ADDRESSABLE APERTURES

(71) Applicant: Avago Technologies International Sales Pte. Limited, Singapore (SG)

(72) Inventors: Tak Kui Wang, San Jose, CA (US); Chung-Yi Su, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/965,095

(22) Filed: Apr. 27, 2018

(51) Int. Cl.
| | |
|---|---|
| *H01S 5/00* | (2006.01) |
| *H01S 5/042* | (2006.01) |
| *H01S 5/183* | (2006.01) |
| *H01S 5/42* | (2006.01) |
| *H01S 5/22* | (2006.01) |
| *H01S 5/022* | (2006.01) |
| *H01S 5/024* | (2006.01) |

(52) U.S. Cl.
CPC ........ *H01S 5/0425* (2013.01); *H01S 5/02272* (2013.01); *H01S 5/02288* (2013.01); *H01S 5/02461* (2013.01); *H01S 5/183* (2013.01); *H01S 5/18386* (2013.01); *H01S 5/18394* (2013.01); *H01S 5/22* (2013.01); *H01S 5/423* (2013.01)

(58) Field of Classification Search
CPC .... H01S 5/0425; H01S 5/02288; H01S 5/183; H01S 5/22; H01S 5/423; H01S 5/02272; H01S 5/02461; H01S 5/18386; H01S 5/18394

See application file for complete search history.

(56) References Cited

U.S. PATENT DOCUMENTS

| | | | | |
|---|---|---|---|---|
| 5,337,074 | A * | 8/1994 | Thornton | B41J 2/45 257/E27.121 |
| 6,323,059 | B1 * | 11/2001 | Yoshida | B82Y 20/00 257/678 |
| 7,598,149 | B2 * | 10/2009 | Dawson | H01L 27/156 257/E21.377 |
| 2002/0005523 | A1 * | 1/2002 | Taniguchi | H01L 27/153 257/79 |
| 2006/0222033 | A1 * | 10/2006 | Hayakawa | H01S 5/06256 372/50.11 |
| 2016/0006213 | A1 * | 1/2016 | Su | G02F 1/01708 372/45.01 |
| 2018/0006426 | A1 * | 1/2018 | Takiguchi | G02B 27/1026 |
| 2018/0019426 | A1 * | 1/2018 | Im | H01L 51/0512 |

* cited by examiner

*Primary Examiner* — Kinam Park
(74) *Attorney, Agent, or Firm* — Sheridan Ross P.C.

(57) ABSTRACT

Optical devices and systems are depicted and described herein. One example of the optical system is disclosed to include a semiconductor layer, a first metal strip positioned adjacent to a first surface of the semiconductor layer, a second metal strip positioned adjacent to a second surface of the semiconductor layer that opposes the first surface of the semiconductor layer, and a third metal strip positioned adjacent to the second surface of the semiconductor layer. In one example, the first metal strip includes a first aperture positioned adjacent to a first active region in the semiconductor layer and second aperture positioned adjacent to a second active region in the semiconductor layer. The second metal strip overlaps the first metal strip in proximity with the first active region and not the second active region and the third metal strip is oriented substantially parallel with the second metal strip.

20 Claims, 14 Drawing Sheets

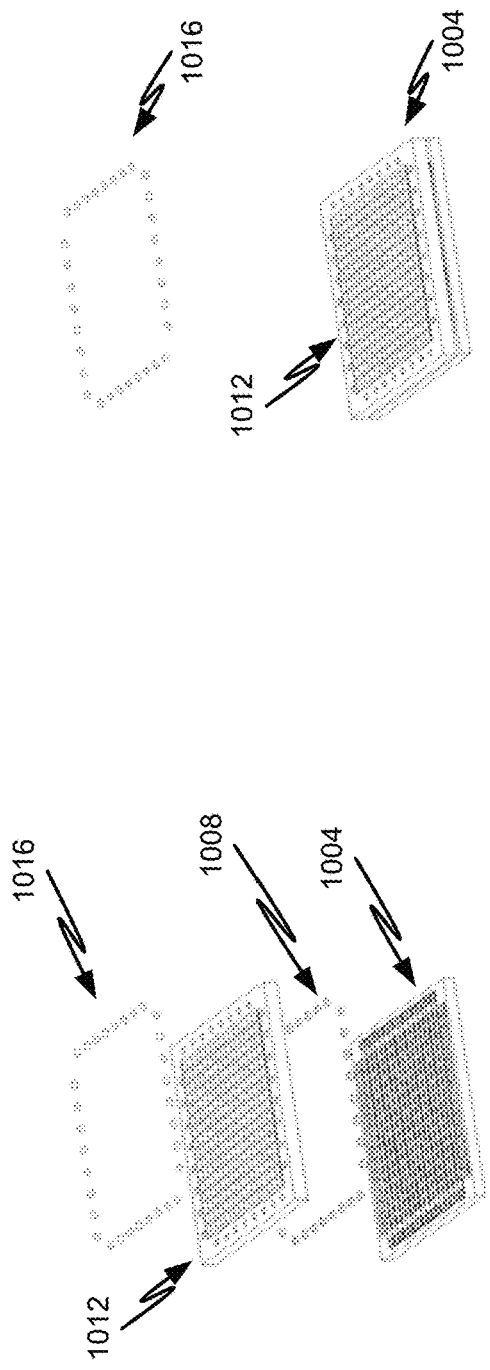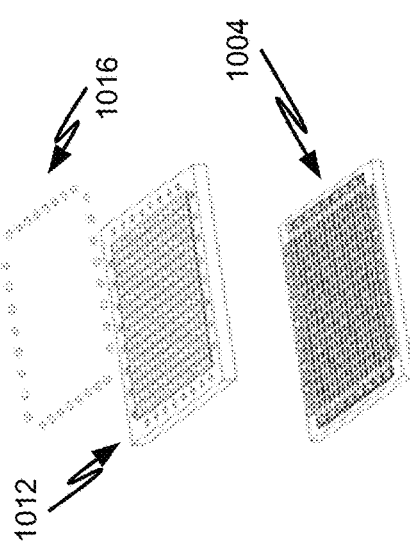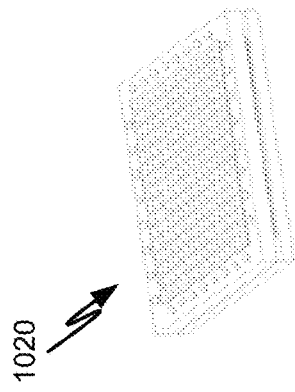
FIG. 10A
FIG. 10B
FIG. 10C
FIG. 10D

OPTICAL DEVICE AND SYSTEM HAVING AN ARRAY OF ADDRESSABLE APERTURES

FIELD OF THE DISCLOSURE

Example embodiments are generally directed toward optical devices and systems.

BACKGROUND

The ease of forming two-dimensional arrays is one advantage of a Vertical-Cavity Surface-Emitting Laser (VCSEL) over edge-emitting lasers. Such arrays are particularly useful in applications where each element of the array can be individually addressed, for example where it is desirable to produce a sequentially-scanning laser source. However, due to its low defect density, n-type substrates are preferred in constructing a VCSEL. With a conductive substrate, individual addressing each array element can only be achieved by electrically isolating the p-contact of each element from another element in the array, instead of in the more convenient row-column selection configuration. Furthermore, to minimize temperature rise of the individual elements, and thermal crosstalk between array elements from degrading VCSEL performance, in creating the assembly/packaging of a scanning laser source, it is preferred to mount the VCSEL die with the p-side down onto a sub-mount having high thermal conductivity.

To connect each of the isolated elements of a large array (e.g., a 16×16 array) to the laser driver circuitry with passive traces on the sub-mount, however, requires complex multi-layer construction of the sub-mount. Such complex sub-mounts, even if feasible, impede the heat flow from the VCSEL. This effectively defeats the advantage offered by the p-down configuration. Furthermore, the configuration requires an individual driver for each of the array elements.

One solution to the above-noted issue is to use an active matrix row-column switch to simplify the routing required on the sub-mount, but such active matrix switches similarly interfere with the heat flow from the VCSEL. Even if the thermal degradation introduced by a multi-layer sub-mount and/or an active matrix switch chip can be managed, light must emit from the n-substrate side and, therefore, limits the VCSEL to operate at a long wavelength that is transparent to the substrate (e.g., for a GaAs-based VCSEL, the wavelength used must be longer than 940 nm). However, the n-doping of the substrate increases the free carrier absorption especially at longer wavelengths, which lower the efficiency of the VCSEL. Accordingly, a VCSEL array is desired that is directly row-column addressable while maintaining high thermal conductivity without restriction on the emission wavelength.

BRIEF DESCRIPTION OF THE DRAWINGS

Inventive concepts are described in conjunction with the appended figures, which are not necessarily drawn to scale:

FIG. 10A is a first exploded view of an optical device in accordance with at least some embodiments of the present disclosure;

FIG. 10B is a second exploded view of the optical device from FIG. 10A;

FIG. 10C is a third exploded view of the optical device from FIG. 10A; and

FIG. 10D is an isometric view of the fully-constructed optical device from FIG. 10A;

DETAILED DESCRIPTION

Figure 1:
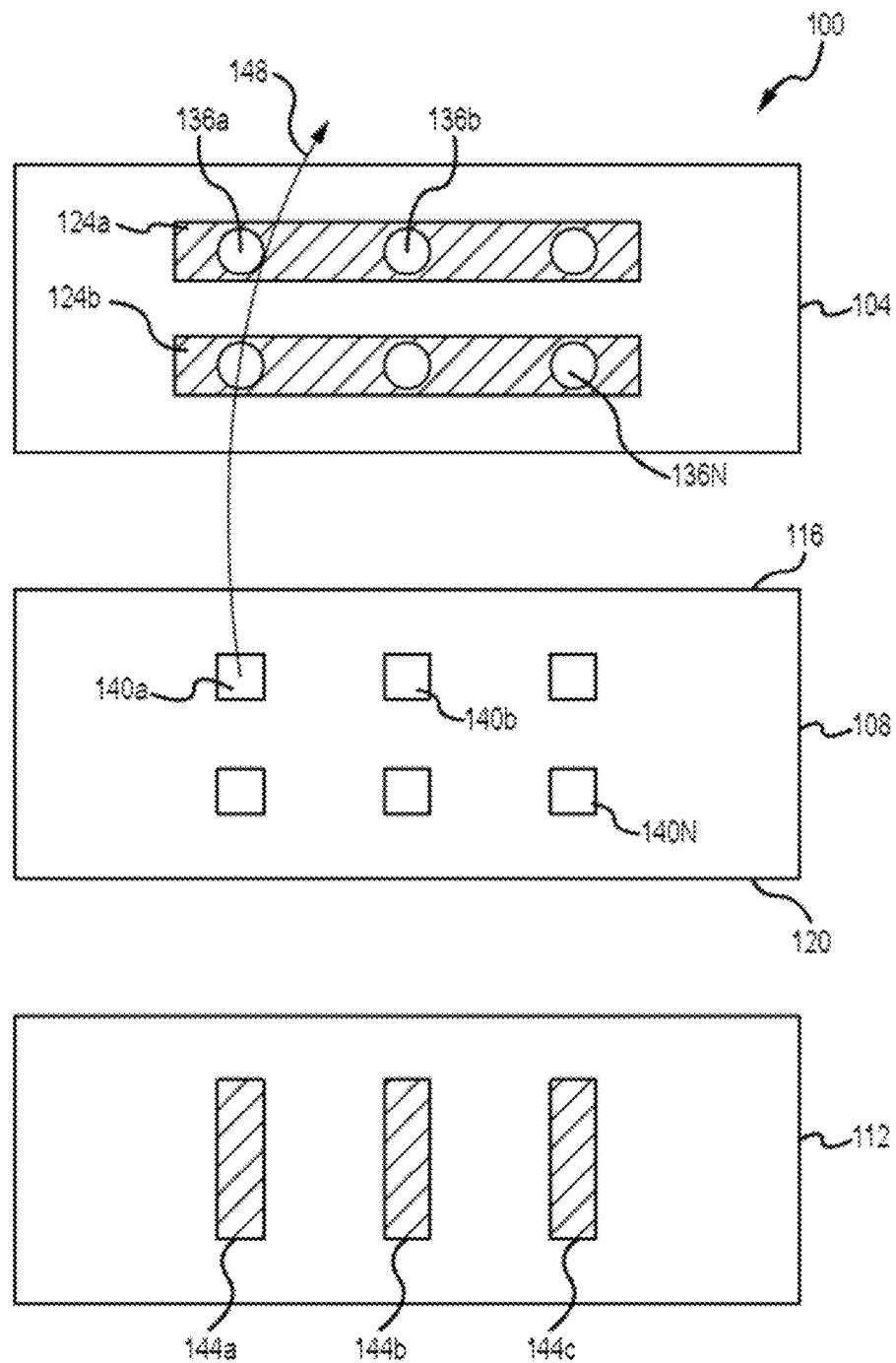
FIG. 1 is a block diagram depicting an optical system in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-12, various configurations of optical devices and systems are depicted and described. Methods for constructing optical devices and systems are also depicted and described. In some embodiments, the optical device(s) may include:

a semiconductor layer having a first surface and a second surface opposing the first surface, the semiconductor layer having a plurality of active regions;

a plurality of first metal strips positioned adjacent to the first surface, each of the plurality of first metal strips being in a substantially parallel arrangement and oriented in a first direction;

a plurality of apertures positioned on the plurality of first metal strips; and a plurality of second metal strips positioned adjacent to the second surface, each of the plurality of second metal strips being in a substantially parallel arrangement and oriented in a second direction that forms an angle relative to the first direction, where at least one of the plurality of active regions is positioned at an intersection residing between a metal strip in the plurality of first metal strips and a metal strip in the plurality of second metal strips, and where the plurality of active regions are positioned in correspondence with the plurality of apertures, respectively, such that the plurality of active regions are adaptable to emit light independently through at least one corresponding aperture.

In another aspect of the present disclosure, the optical device may further include a non-native substrate positioned adjacent to the second surface of the semiconductor layer, where the plurality of second metal strips are disposed on the non-native substrate. The non-native substrate may include at least one of an $Al_2O_3$, AlN, SiC, or Si substrate.

In another aspect of the present disclosure, the semiconductor layer includes a plurality of mesa structures positioned adjacent to the plurality of apertures, respectively, and furthermore the plurality of active regions are situated adjacent to the plurality of mesa structures, respectively, such that the plurality of mesa structures are optically coupled to the plurality of active regions. In some embodiments, one or more of the plurality of active regions is configured to generate spatial coherent light beams that emit through the corresponding aperture(s). Alternatively or additionally, the semiconductor layer includes a plurality of trench structures defining the plurality of mesa structures. Additionally, the semiconductor layer may further include a plurality of electrically isolated regions surrounding the plurality of active regions, respectively, such that each of the plurality of active regions can be selected to emit light substantially independent of the others of the plurality of active regions. In some embodiments, light in a first active region is guided by a corresponding mesa structure in conjunction with the corresponding electrically isolated region surrounding the corresponding mesa structure to produce lasing that is confined to the corresponding aperture (s).

In another aspect of the present disclosure, the optical device further includes a plurality of lens structures, where each of the plurality of lens structures is arranged corresponding to the plurality of apertures. In some embodiments, the optical device further includes an optical spacer layer adjacent to the first surface of the semiconductor layer and the plurality of lens structures are disposed on a first surface of the optical spacer layer. The optical spacer layer may further include a second surface opposing the first surface and the plurality of lens structures are situated on the second surface and distanced away from the plurality of apertures.

In another aspect of the present disclosure, the semiconductor layer includes an epitaxial layer having a front surface and a back surface that is opposing the front surface, the plurality of active regions are positioned on the front surface, and the plurality of first metal strips are positioned on the back surface.

In another aspect of the present disclosure, when one of the plurality of active regions is selected to emit light, an electric current flows through the one of the plurality of active regions in a third direction that is orthogonal to the first and second directions.

In another aspect of the present disclosure, each of the plurality of active regions includes a cathode terminal and an anode terminal, each of the plurality of active regions is configured to emit light when the anode terminal is coupled to a first voltage and the cathode terminal is coupled to a second voltage that is lower than the first voltage. In some embodiments, the plurality of first metal strips are electrically coupled to one of the cathode terminal of each of the plurality of active regions, and the plurality of second metal strips are electrically coupled to one of the anode terminals of each of the plurality of active regions.

In another aspect of the present disclosure, when the optical device is configured not to emit light in an OFF-state, all of the plurality of first metal strips and all of the plurality of second metal strips are biased at a TURN-OFF current level such that the plurality of active regions are biased below a light emitting threshold so as not to emit light.

In another aspect of the present disclosure, when the optical device is configured such that only one of the plurality of active regions is to emit light, a corresponding second metal strip and a corresponding first metal strip that are electrically coupled to the one of the plurality of active regions pass a current above the light emitting threshold of the one active region, and the other second metal strips and the other first metal strips are biased draw no current or a current below the light-emitting threshold of the other active regions.

In another aspect of the present disclosure, the plurality of first metal strips are electrically connected to the plurality of active regions respectively without a matrix switch. Alternatively or additionally, the plurality of second metal strips are electrically connected to the plurality of active regions respectively without a matrix switch.

In another aspect of the present disclosure, the optical device includes a vertical cavity surface-emitting laser (VCSEL).

In another aspect of the present disclosure, the angle of the second metal direction is 90 degrees or less relative to the first metal direction.

In some embodiments depicted and described herein, an optical device or optical system may include:
a semiconductor layer;
a first metal strip positioned adjacent to a first surface of the semiconductor layer, where the first metal strip comprises a first aperture that is positioned adjacent to a first active region in the semiconductor layer, and where the first metal strip comprises a second aperture that is positioned adjacent to a second active region in the semiconductor layer;
a second metal strip positioned adjacent to a second surface of the semiconductor layer that opposes the first surface of the semiconductor layer, where the second metal strip overlaps the first metal strip in proximity with the first active region and not the second active region; and
a third metal strip positioned adjacent to the second surface of the semiconductor layer, where the third metal strip is oriented substantially parallel with the second metal strip, and wherein the third metal strip overlaps the first metal strip in proximity with the second active region and not the first active region. In some embodiments, the second and third metal strip may be physically provided a non-native substrate that is adjacent to the second surface of the semiconductor layer.

In some embodiments depicted and described herein, an optical device may include:
a plurality of light emitting components arranged in a two-dimensional manner, each of the light emitting components comprising:
  a substrate,
  a semiconductor layer having a first surface and a second surface, wherein the second surface faces toward the substrate,
  an active region of the semiconductor layer disposed adjacent to the second surface,
  an optical structure layer disposed on the first surface of the semiconductor layer, wherein the optical structure layer comprises a lens structure,
  a first metal layer sandwiched between the optical structure layer and the semiconductor layer,
  a second metal layer sandwiched between the semiconductor layer and substrate, and
  an aperture positioned on the first metal layer, wherein the lens structure, the aperture and the active region are optically coupled to each other such that an optical radiation emitted from the active region is directed through the aperture towards the lens structure;
a plurality of first metal structures, wherein the first metal layer belongs to the plurality of first metal structures; and
a plurality of second metal structures, wherein the second metal layer belongs to the plurality of second metal structures,
wherein the plurality of light emitting components are independently addressable through selective biasing of the plurality of first metal structures and the plurality of second metal structures.

In one aspect of the present disclosure, the substrate is a non-native substrate that includes substantially one of an $Al_2O_3$, AlN, SiC, and Si, and the semiconductor layer includes substantially GaAs.

In another aspect, the plurality of second metal structures are disposed on the (non-native) substrate. Alternatively or additionally, the semiconductor layer includes a bottom metal layer electrically connecting the active region and one of the plurality of second metal structures.

As will be appreciated, various types and configurations of optical devices or optical systems will be depicted and described herein. It should be appreciated that any intermediate type of device or collection of components may be referred to as an optical device or an optical system without departing from the scope of the present disclosure. Moreover, an optical system may include a single optical device or a plurality of optical devices without departing from the scope of the present disclosure.

Referring now to FIG. 1, an illustrative optical system 100 will be described in accordance with at least some embodiments of the present disclosure. The optical system is shown to include a plurality of first metal strips 104 and a plurality of second metal strips 112 with a semiconductor layer 108 sandwiched there between. In some embodiments, the semiconductor layer 108 includes a first surface 116 and an opposing second surface 120. The first surface 116 of the semiconductor layer 108 is substantially proximal or adjacent to the plurality of first metal strips 104. The second surface 120 of the semiconductor layer 108 is substantially proximal or adjacent to the plurality of second metal strips 112.

The plurality of first metal strips 104 is shown to have at least a first metal strip 124a and a second metal strip 124b arranged in a first direction. Each metal strip 124a, 124b may include a plurality of apertures 136a-N and may be physically separated from one another by a gap having a predetermined size. In some embodiments, the gap between each metal strip is approximately the same size as any other gap between any other adjacent strips in the plurality of first metal strips 104.

The apertures 136a-N may be arranged across the strips 124a, 124b with a predetermined amount of space between each aperture 136. Thus, the distance between any two adjacent apertures 136 on a common metal strip may be substantially the same. Similarly, the distance between any two adjacent apertures 136 on each strip may be substantially as the distance between any two adjacent apertures 136 on another strip. Thus, each metal strip 124a-N may have a similar or identical number of apertures 136 arranged thereon and the spacing between each aperture 136 may be substantially the same. Because each of the metal strips 124a, 124b in the plurality of first metal strips 104 are arranged substantially parallel to one another (e.g., each metal strip is arranged in the same first direction), the apertures 136 on each strip 124a, 124b may also be considered to have a parallel arrangement with respect to apertures 136 on any other strip. Accordingly, the apertures 136 may be arranged in an array of apertures based on the distribution of apertures 136 along a particular strip and based on the relative position of each strip 124a, 124b.

The semiconductor layer 108 is shown to include a plurality of active regions 140a-N. In some embodiments, the number of active regions 140a-N is equal to the number of apertures 136a-N. Furthermore, the active regions 140a-N may also be arranged in an array that is similar in size and configuration to the arrangement of the apertures 136. In this way, each aperture may be considered to be positioned adjacent to a particular active region in the plurality of active regions 140a-N. It should be appreciated, however, that an active region 140a-N may have a corresponding plurality of apertures through which light can travel. For instance, the first active region 140a may be considered to be arranged proximate to the first aperture 136a on the first strip 124a and possibly at least one other aperture that is adjacent the first aperture 136a. In some embodiments, this means that light emitted by the first active region 140a passes through at least the first aperture 136a, possibly through at least one other adjacent aperture, and not the other apertures in other active regions. Similarly, the second active region 140b may be considered to be arranged proximate to the second aperture 136b on the first strip 124a and possibly at least one other aperture that is adjacent the second aperture 136b. This suggests that light emitted by the second active region 140b passes through the second aperture 136b, possibly through at least one other adjacent aperture, and not the other apertures in other active regions. Continuing the example, the Nth active region 140N may be considered to be arranged proximate to the Nth aperture 136N on the second strip 124b and possibly at least one other aperture that is adjacent the Nth aperture 136N, which means that light emitted by the Nth active region 140N passes through at least the Nth aperture 136N, possibly through at least one other adjacent aperture, and not through other apertures in other active regions. In some embodiments, there is at least 1-to-1 correlation between the number of apertures 136 and the number of active regions 140. As discussed above, there may also be an N-to-1 correlation between the number of apertures 136 and a number of active regions 140, where N is great than one, meaning that at least one active region 140 may have two or more apertures 136 correlated thereto. It should be appreciated that the proximate relationship between active regions 140 and apertures 136 can be achieved by physically overlapping the array of active regions 140 with the array of apertures 136. In some embodiments this overlapping arrangement is made possible by placing the plurality of first metal strips 104 adjacent to the first surface 116 of the semiconductor layer 108.

In accordance with at least some embodiments, the semiconductor layer 108 may correspond to or include any type of semiconductor material. As an example, the semiconductor layer 108 may comprise an epitaxial layer. In some embodiments, each of the active regions 140a-N may correspond to Vertical-Cavity Surface-Emitting Laser (VCSEL) regions arranged across an epitaxial wafer. Any type of known semiconductor material or combination of semiconductor materials may be used for the semiconductor layer 108. Furthermore, although embodiments of the present disclosure will be described primarily in connection with the semiconductor layer 108 corresponding to a VCSEL wafer and the active regions corresponding to p-n junctions of a VCSEL, it should be appreciated that embodiments of the present disclosure are not so limited. For instance, any type of light-emitting device may be used for the active regions 140a-N including, without limitation, Light Emitting Diodes (LEDs) or any other type of device that produces light 148 in response to having electrical current passed there through.

In some embodiments, each active region 140a-N may be configured to produce a coherent beam of emitted light 148 in response to having a predetermined voltage applied across the active region 140 (thereby causing current to flow through the semiconductor layer 108 in the active region 140). The voltage may be applied across an active region by selectively applying a control signal (or pair of control signals) across a particular metal strip in the plurality of first metal strips 104 and a particular metal strip in the plurality of second metal strips 112.

As shown in FIG. 1, the plurality of second metal strips 112 are shown to be arranged orthogonal to the first direction in which the plurality of first metal strips 104 are arranged. Thus, only a metal strip in the plurality of second metal strips 112 intersects only one metal strip in the plurality of first metal strips 104. The area where one metal strip from the plurality of first metal strips 104 overlaps a metal strip from the plurality of second metal strips 112 may correspond or be positioned proximate to a single active region. Thus, each active region 140 represents an intersection between a unique pair of metal strips from the plurality of first metal strips 104 and plurality of second metal strips 112. As a non-limiting example, the first active region 140a may correspond to an area of the semiconductor layer 108 sandwiched between the orthogonal metal strips where the first metal strip 124a from the plurality of first metal strips 104 overlaps the first metal strip 144a from the plurality of second metal strips 112. The second active region 140b may correspond to an area of the semiconductor layer 108 sandwiched between the orthogonal metal strips where the first metal strip 124a from the plurality of first metal strips 104 overlaps the second metal strip 144b from the plurality of second metal strips 112. Continuing the example, the Nth active region 140N may correspond to an area of the semiconductor layer 108 sandwiched between the orthogonal metal strips where the second metal strip 124*b* from the plurality of first metal strips 104 overlaps the third metal strip 144*c* from the plurality of second metal strips 112.

As will be discussed in further detail herein, the optical system 100 may further include a control circuit that is in electrical communication with the plurality of first metal strips 104 and plurality of second metal strips 112. The control circuit may be configured to selectively and independently activate or de-activate the regions 140*a*-N by applying predetermined control signals to the plurality of metal strips 104, 112. In some embodiments, the control circuit may not need the assistance of a switch or switched circuit to facilitate the independent operation of the active regions. For example, a predetermined control signal may be simultaneously applied to the pair of metal strips 124*a*/144*a* to activate the first active region 140*a* and not the other active regions. Similarly, a predetermined control signal may be simultaneously applied to the pair of metal strips 124*a*/144*b* to activate the second active region 140*b* and not the other active regions. As used herein, a "predetermined control signal" may correspond to an application of a predetermined voltage to a pair of metal strips that creates an electrical potential difference between the pair of metal strips but not other pairs of metal strips that will cause the corresponding active region 140 to become appropriately biased, thereby causing the active region to produce emitted light 148. All other active regions that do not have the same bias applied thereto will not produce emitted light 148. In some embodiments, the control circuit may only activate one active region 140 at a time in an addressable manner by selectively applying bias current to the metal strips 104, 112. Multiple active regions can also be simultaneously activated by supplying bias to multiple pairs of metal strips 124 and/or 144.

In some embodiments, the number of active regions 140 may correspond to a product of the number of metal strips in the plurality of first metal strips 104 and the number of metal strips in the plurality of second metal strips 112. Although the block diagram of FIG. 1 depicts six active regions 140, it should be appreciated that an optical system 100 or optical device may include a greater or lesser number of active regions without departing from the scope of the present disclosure. The illustration of six active regions 140 is provided for ease of reference and discussion.

Figure 2A:
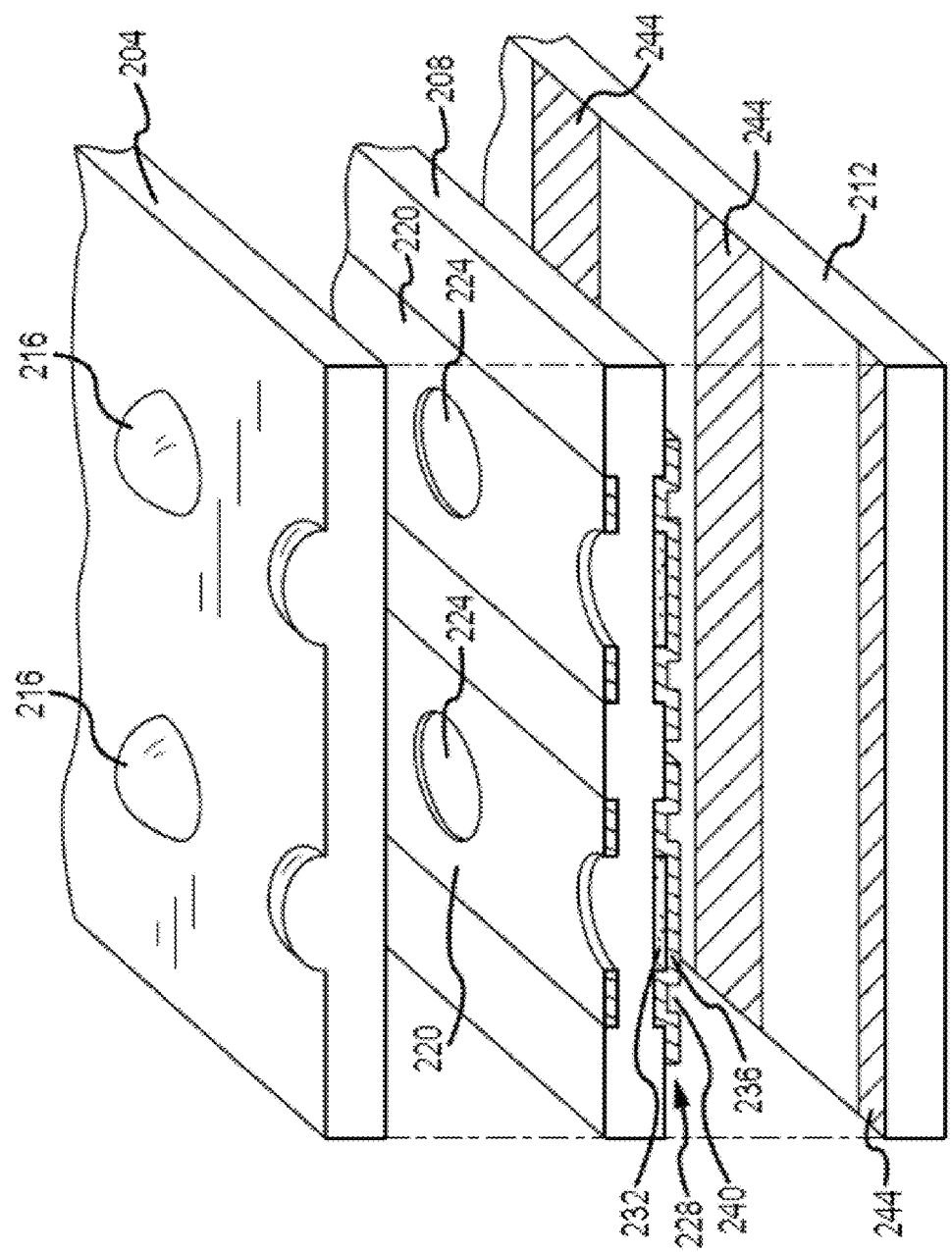
FIG. 2A is a cross-sectional, exploded, isometric view of an optical device in accordance with at least some embodiments of the present disclosure.
Figure 2B:
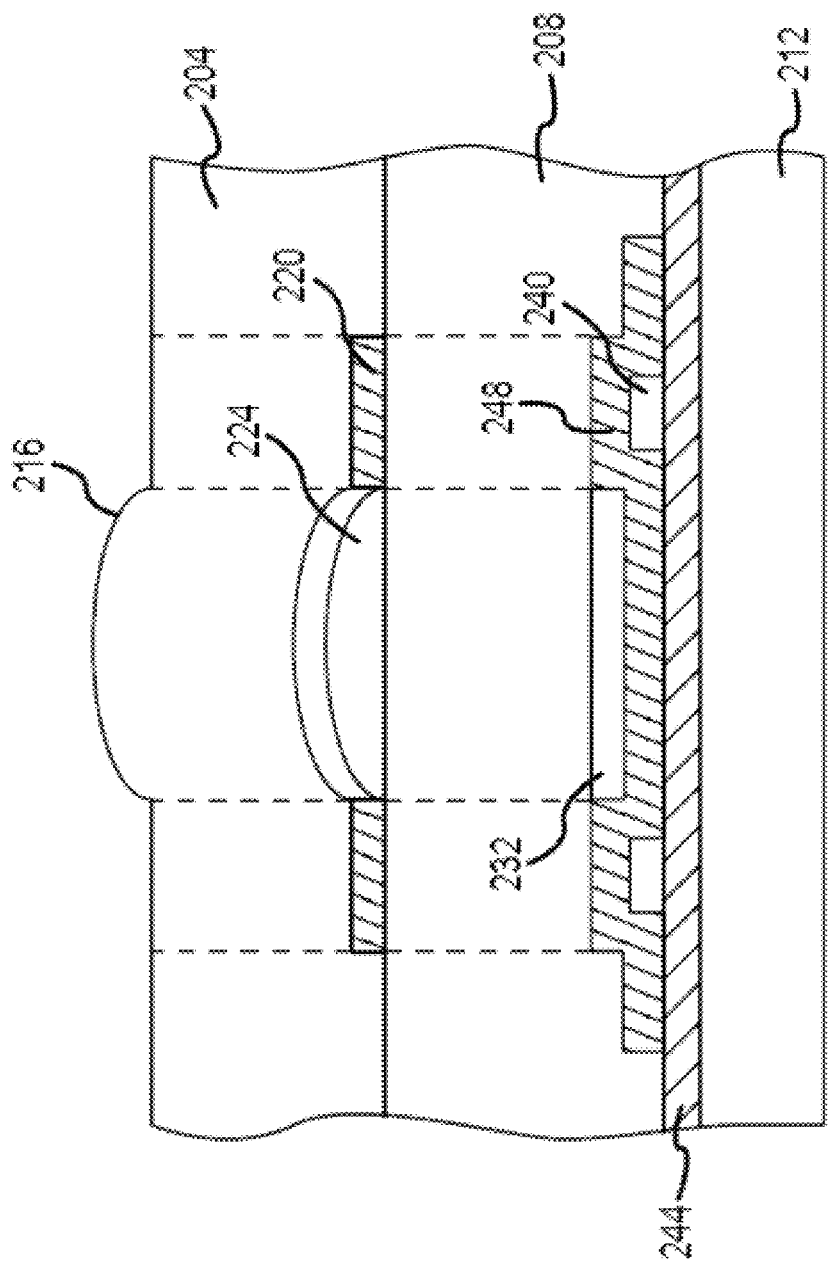
FIG. 2B is a cross-sectional view of the optical device from FIG. 2A.

With reference now to FIGS. 2A-C, a more specific, but non-limiting, example of an optical device that may be provided as part of the optical system 100 will be described in accordance with at least some embodiments of the present disclosure. The optical device is shown to include a semiconductor layer 208 having a plurality of first metal strips 220 positioned on its first side and a plurality of second metal strips 244 positioned on the non-native substrate near its second side. The cover 204 is shown to include a plurality of optical elements 216, which may be provided as lens structures on the top surface of the cover 204. Each optical element 216 may overlap or be positioned in proximity with a corresponding active region 232 in the semiconductor layer 208. Thus, light emitted by a particular active region 232 may travel through the corresponding optical element 216 without traveling through other optical elements. The light emitted by a particular active region 232 may first pass through a corresponding aperture 224 in the plurality of first metal strips 220. In some embodiments, each metal strip in the plurality of first metal strips 220 may correspond to an n-metal strip. The n-metal strips 220 may correspond to an example of first strips 124 as shown in FIG. 1. The n-metal strips 220 may have a plurality of apertures 224 formed therein, which correspond to examples of apertures 136 as shown in FIG. 1. The n-metal strips 220 are shown to be oriented in a first direction and are co-planar with a top surface of the semiconductor layer 208 (e.g., the surface of the semiconductor layer 208 that is proximate the cover 204.

The opposite side of the semiconductor layer 208 (e.g., the surface of the semiconductor layer 208 that is proximate the substrate 212) may have a plurality of trenches 240 and mesa structures 236 formed therein. The trenches 240 and mesa structures 236 may provide a suitable area for the material of the active region 232 to reside. In some embodiments, the active regions 232 may correspond to p-n junctions in the semiconductor layer 208. Thus, the semiconductor layer 208 may represent an example of the semiconductor layer 108 and the active regions 232 may represent examples of active regions 140. Each active region 232 is overlapped by a corresponding aperture 224 in the n-metal strip 220 and an optical element 216. In some embodiments, the bottom side of the semiconductor layer 208 is placed into contact with the substrate 212, thereby creating an overlapping relationship between the metal strips 244 and the various active regions 232.

In some embodiments, each metal strip in the plurality of second metal strips 244 may correspond to a p-metal strip. The p-metal strips 244 may correspond to examples of strips 144 shown in FIG. 1. The p-metal strips 244 may be oriented transverse or orthogonal to the n-metal strips 220 such that a p-metal strip 244 only overlaps a single n-metal strip 220 at a single active region 232. As can be appreciated, the p-metal strips 244 and n-metal strips 220 are positioned on two different planes that are parallel and non-intersecting. The spacing between p-metal strips 244 (e.g., a distance from a center of one p-metal strip 244 and a center of an adjacent p-metal strip 244) may be substantially the same as the distance between apertures 224 in the n-metal strips 220 (e.g., a distance from a center of one aperture 244 and an adjacent aperture 244 on the same n-metal strip 220). The active regions 232 may be activated by a control circuit selectively applying a bias voltage between a particular n-metal strip 220 and a particular p-metal strip 244, thereby causing a current to flow from the p-metal strip to the n-metal strip.

The substrate 212, in some embodiments, corresponds to a non-native substrate. The material used in the substrate 212 may, therefore, depend upon the type of material used in the semiconductor layer 208. As some non-limiting examples, the substrate 212 may include one or more of an $Al_2O_3$, AlN, SiC or Si substrate. The p-metal strips 244 may be formed directly on the top surface of the substrate 212 by any type of known metal deposition process.

FIG. 2B shows additional details of the intersection area 228 where the active region 232 resides. Each intersection area 228 is shown to have a corresponding active region 232, which is situated at a location where the p-metal strip 244 is overlapped by the n-metal strip 220. The active region 232 is positioned on top of a mesa structure 236 and within the mesa structures 248 created by the trenches 240. In some embodiments, the active region 232 is substantially aligned with its corresponding aperture 224 such that the opening of the aperture 224 (e.g., the hole in the metal of the n-metal strip 220) has approximately the same diameter and the p-n junction that forms the active area 232. Thus, although not shown in the cross-sectional view, the shape of the mesa structures 236, 248 may be similar or identical to the shape of the aperture 224. For instance, the mesa structure 236 may comprise a circular plateau and the aperture 224 may be a similarly-sized circular opening in the n-metal strip 220. As will be discussed in further detail herein, the mesa structures 236 may be formed directly or indirectly by the formation of the trench 240. The mesa structures 236 may provide light guiding functions for light emitted by the active region 232.

FIG. 2B also shows the alignment of an optical element 216 with the aperture 224 and active region 232. In some embodiments, the optical element 216 comprises a lens formed in the cover 204. As a non-limiting example, the optical element 216 may correspond to a convex lens formed using a wafer-forming process such that the lens is formed from the material of the cover 204. As can be appreciated, a plurality of lenses may be formed simultaneously in the cover 204.

It should be appreciated that the active region 232 emits light in a general upward direction (e.g., away from the substrate 212). In some embodiments, the light emitted by the active region 232 is a collimated beam of light. In some embodiments, the light emitted by the active region 232 is guided by a light guide. As a specific but non-limiting example, the mesa structure 236 is used to create an optical refractive index difference between the aperture region and a surrounding region to help confine the light inside or within the aperture 224, this may be referred to as index-guiding. It may also be possible to use ion implantation to remove the electrical conductivity of the semiconductor layer in the region adjacent to the aperture 224 to force current injection only into the area of aperture 224, this may be referred to as gain-guiding.

It should be appreciated that each active region 232 and intersection area 228 formed in a given optical device may be similar or identical to all other active regions 232 and/or intersection areas 228 on the same optical device without departing from the scope of the present disclosure, although such a design is not required by embodiments of the present disclosure.

Figure 3:
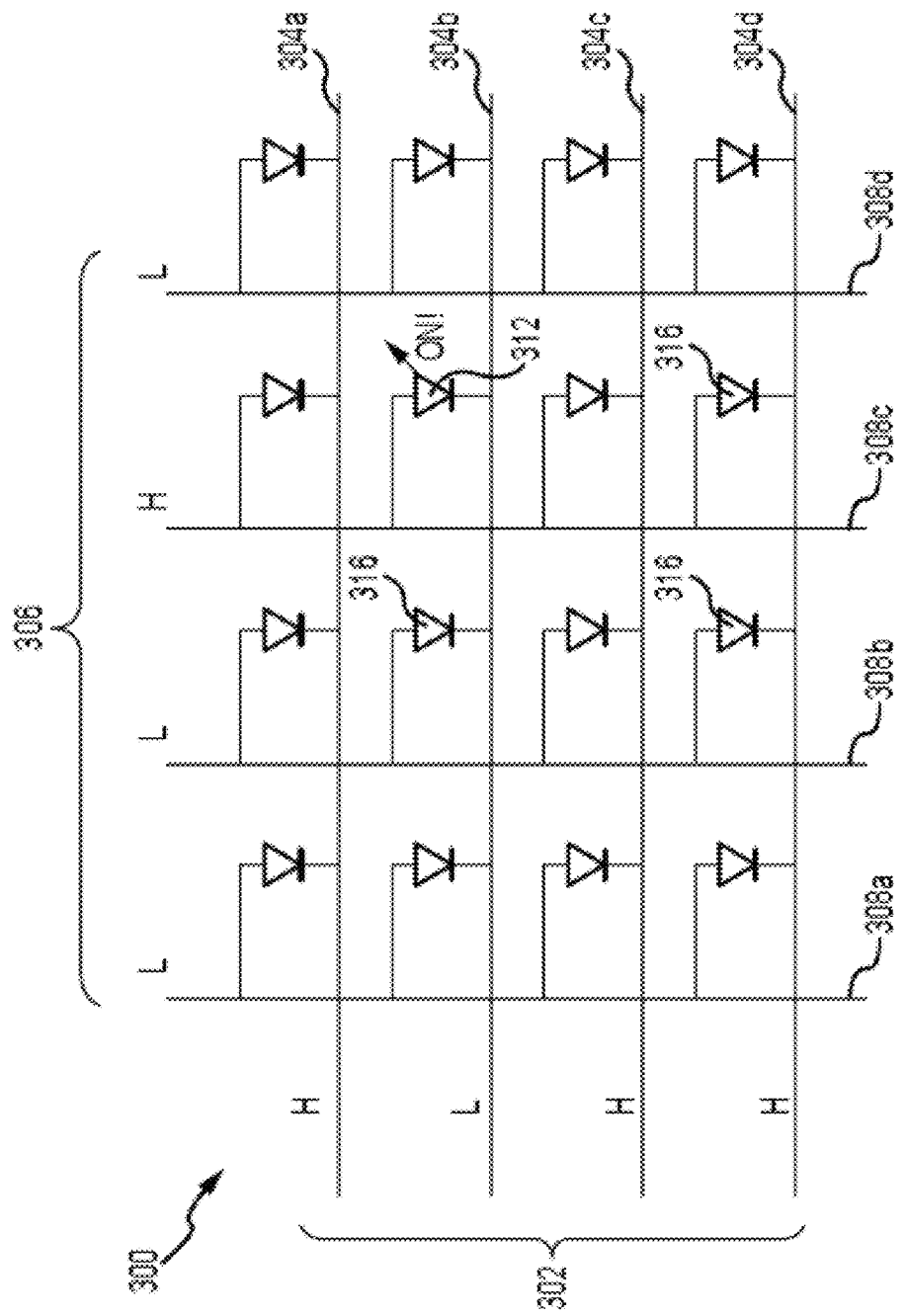
FIG. 3 is a circuit diagram depicting an array of active regions in accordance with at least some embodiments of the present disclosure.

With reference to FIG. 3, additional details of the operation of active regions 140, 232 will be described in accordance with at least some embodiments of the present disclosure. FIG. 3 depicts an array of active regions 300 and the circuit diagram used to operate the various active regions in the array of active regions 300. It should be appreciated that any of the active regions depicted or described herein may be operated in the fashion shown in FIG. 3. Specifically, the array of active regions 300 may include a plurality of active regions 140, 232 arranged in a two-dimensional grid with a predetermined spacing between each of the active regions 140, 232. This results in the physical layout of the array of active regions 300.

The active regions may be electrically interconnected by a first plurality of metal strips 304 and a second plurality of metal strips 308. Although the first plurality of metal strips 304 is shown to include four metal strips 304a-d and the second plurality of metal strips 308 is shown to include four metal strips 308a-d, embodiments of the present disclosure are not so limited. For instance, the array may include a greater or lesser number of metal strips in either the first or second plurality of metal strips without departing from the scope of the present disclosure. Furthermore, the number of metal strips in the first plurality of metal strips 304 does not necessarily have to equal the number of metal strips in the second plurality of metal strips 308.

As previously discussed, the first plurality of metal strips 304 may extend in a first direction and the second plurality of metal strips 308 may extend in a second direction that is substantially perpendicular or orthogonal to the first direction. This configuration results in the array depicted in FIG. 3. Other layouts (e.g., non-orthogonal) of the metal strips are also envisioned. The first plurality of metal strips 304 may correspond to examples of the metal strips 124 in the plurality of first metal strips 104 and/or the n-metal strips 220. Likewise, the second plurality of metal strips 308 may correspond to examples of the metal strips 144 in the plurality of second metal strips 112 and/or the p-metal strips 244. Thus, the strips 304, 308 may be formed on opposing sides of a semiconductor layer. In some embodiments, the strips in the first plurality of metal strips 304a-d may belong to a cathode of each active region to which they are connected whereas the strips in the second plurality of metal strips 308a-d may belong to the anode. As a non-limiting example, the first plurality of strips 304a-d may belong to a cathode 302 whereas the second plurality of strips 308a-d may belong to the anode 306 of the active regions.

Each metal strip 304, 308 may be configured to carry control signals to at least some of the active regions. Each active region in the array of active regions 300 may be connected to a unique pair of metal strips 304, 308. A control circuit may be connected to all of the metal strips 304, 308 without a switch and may further be configured to activate one or more active regions at a time without necessarily having to activate other active regions. A particular one of the active regions may be activated 312 to produce light when a predetermined bias is applied across that active region. For instance, to activate a particular active regions, the cathode metal strip (e.g., the second metal strip 304b in the first plurality of metal strips) connected to that region may have a second voltage applied thereto while all other cathode metal strips (e.g., the metal strips 304a, 304c, and 304d) connected to other regions have a first voltage applied thereto. In this particular example, the first voltage is shown to be a high voltage whereas the second voltage is shown to be a lower voltage than the first voltage. In some embodiments, the second voltage may correspond to a negative voltage or a voltage of zero. At the same time, the anode metal strip (e.g., the third metal strip 308c in the second plurality of metal strips) connected to the same active region may have a first voltage applied thereto while all other anode metal strips (e.g., the metal strips 308a, 308b, 308d) connected to other regions have a second voltage applied thereto. Continuing the example, the first voltage is again shown to be higher than the second voltage. This results in the creation of a bias across the active region at the intersection of metal strip 304b and metal strip 308c because a high voltage is applied to the anode of the active region and a low voltage is applied to the cathode of the active region. As is known in the optoelectronic arts, this results in the active region becoming an active element 312 and producing light. The other active regions 316 may not have the predetermined bias applied thereto, which means that the other active regions are currently inactive. This effectively enables the control circuit to turn on each active region in the array of active regions 300 one at a time without requiring a switch to be connected between the control circuit and the array 300.

Figure 4:
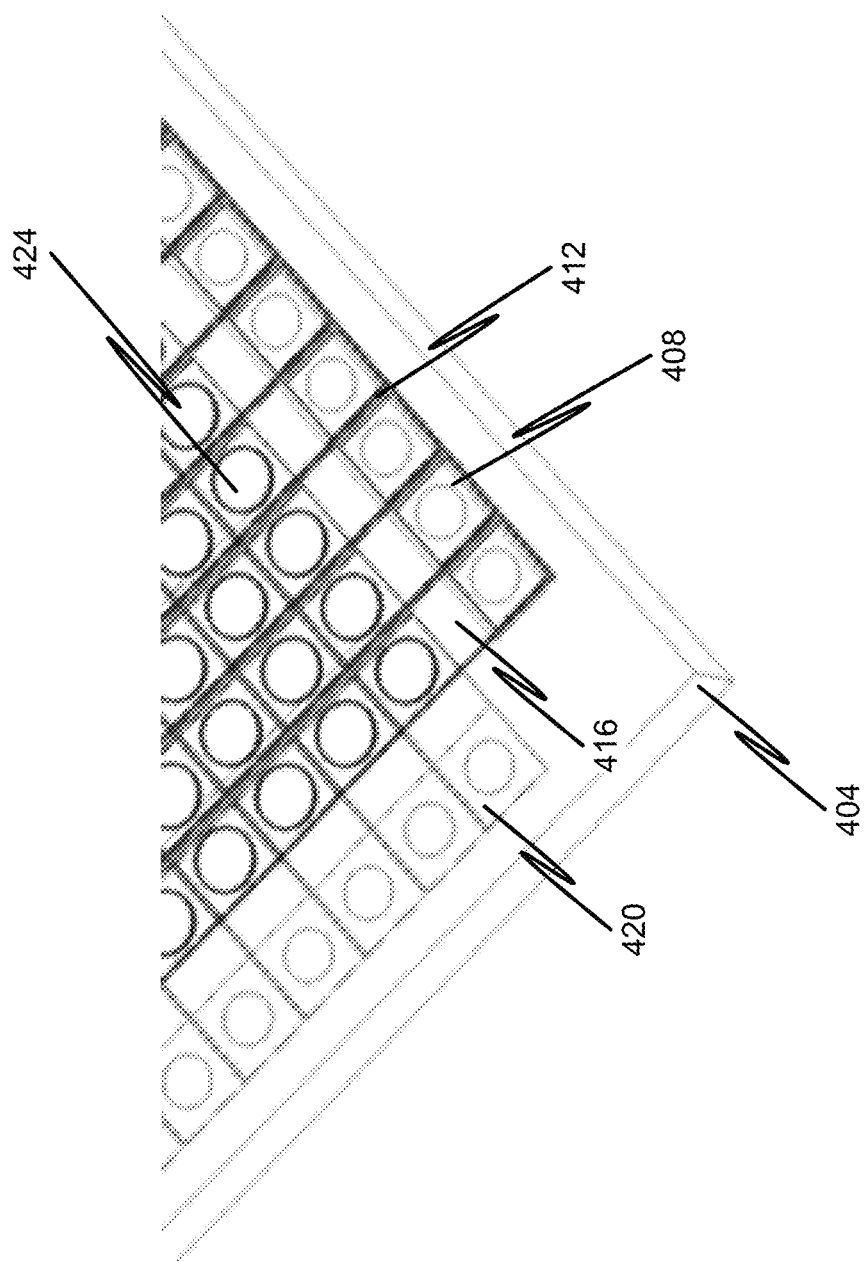
FIG. 4 is an isometric view of a portion of an optical device in accordance with at least some embodiments of the present disclosure.

With reference now to FIG. 4, additional details of an optical device will be described in accordance with at least some embodiments of the present disclosure. It should be appreciated that the optical device depicted in FIG. 4 may correspond to an example of the device depicted in FIG. 1 and/or the device depicted in FIGS. 2A-C. FIG. 4 simply shows additional possible layout details for the candidate components of an optical device constructed in accordance with at least some embodiments of the present disclosure.

FIG. 4 specifically shows a substrate 404 on which a first and second plurality of metal strips are provided. The substrate 404 is specifically shown to support a semiconductor layer 408 that is sandwiched between a plurality of n-metal strips 416 and a plurality of p-metal strips 420. The semiconductor layer 408 may also be referred to as an epitaxial layer or "epi layer" without departing from the scope of the present disclosure. The epi layer 408 is shown to have the plurality of n-metal strips 416 provided on its top surface whereas the plurality of p-metal strips 420 are provided on its bottom surface. The substrate 404 may correspond to an example of substrate 212. The n-metal strips 416 may correspond to examples of strips 124 in the plurality of first metal strips 104 and/or the n-metal strips 220. The p-metal strips 420 may correspond to examples of strips 144 in the plurality of second metal strips 112 and/or the p-metal strips 244.

In some embodiments, the n-metal strips 416 may also be referred to as a cathode column-bus or may be connectable to a cathode column-bus. The p-metal strips 420 may be configured to overlap a corresponding anode row-bus provided on the substrate 404. Thus, an electrical signal provided to the anode row-bus may be transferred to the corresponding p-metal strips 420 and an electrical signal provided to the cathode column-bus may be transferred to the corresponding n-metal strips 416. The n-metal strips 416 may be oriented substantially perpendicular to the p-metal strips 420. The cathode column-bus and the anode row-bus may include contact pads or connection areas that are configured to have wirebonds or solder balls attached thereto. The decision to use wirebonds or solder balls will depend upon the type of package used for the optical device.

Because the cathode column-bus is shown as being provided on the top surface of the epi layer 408, the cathode column-bus may include the plurality of apertures 424, which may be similar or identical to the apertures 136 and/or apertures 224. A row of apertures 424 in the cathode column-bus 416 may overlap a particular one of the p-metal strips 420. Although not shown, each of the apertures 424 may overlap a unique active region in the epi layer 408. The cathode column-bus and anode row-bus may each be separated by gaps of a predetermined size. In some embodiments, the columns of the cathode column-bus may each be isolated from one another by intercolumn isolation trenches 412. The intercolumn isolation trenches 412 may provide the necessary spacing between traces so as to avoid current inadvertently flowing from one trace to another. This effectively enables the independent addressing (e.g., turning on and off) of each active region in the optical device. The intercolumn isolation trenches 412 may be formed by etching through the epi layer 408.

Figure 5:
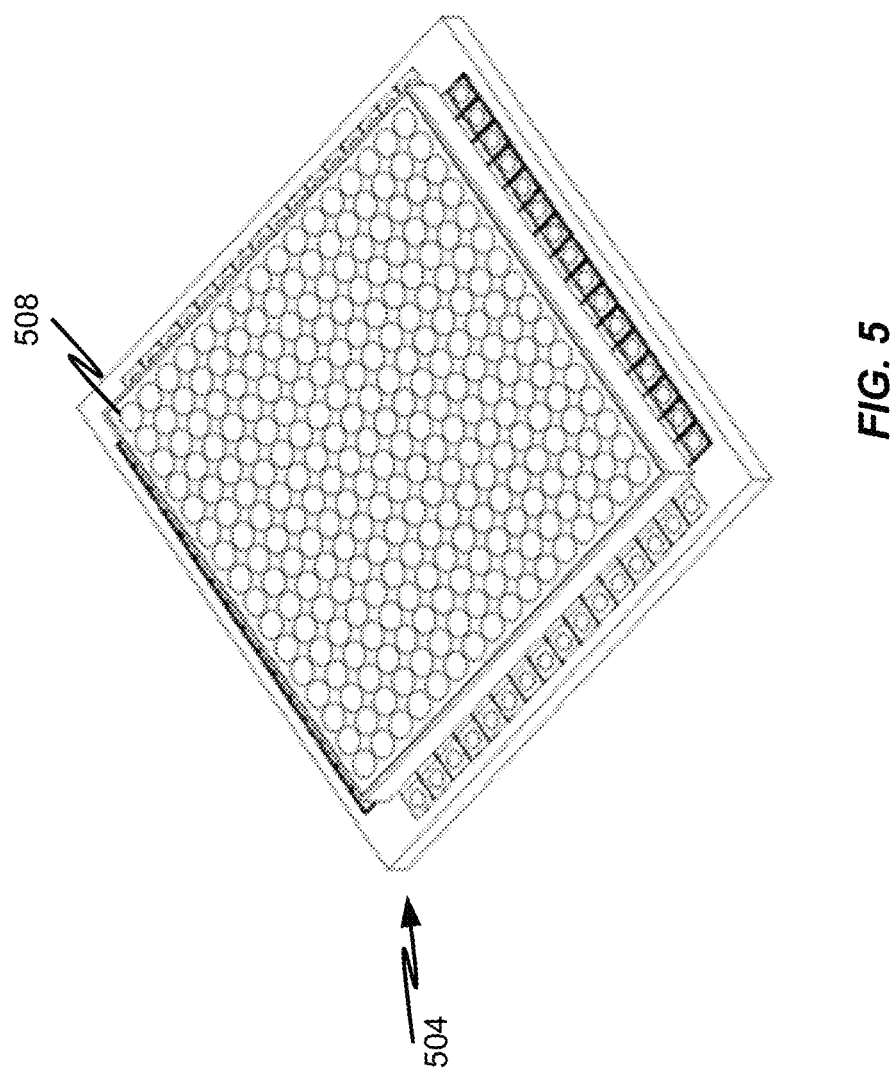
FIG. 5 is an isometric view of another optical device in accordance with at least some embodiments of the present disclosure.

FIG. 5 depicts one possible, but non-limiting, package form factor that can utilize the various optical devices depicted and described herein. It should be appreciated that the package depicted in FIG. 5 may also be referred to as an optical device without departing from the scope of the present disclosure. The optical device of FIG. 5 is shown to have a lens wafer 508 connected to the optical device of FIG. 4. In particular, the optical device of FIG. 4 may be referred to as an optoelectronic die, light-emitting die, or VCSEL die 504. The light-emitting die 504 is shown to have an area that is larger than an area of the lens wafer 508. This larger area of the light-emitting die 504 helps expose the contact pads of the cathode column-bus and anode row-bus for connection to wirebonds. In this particular embodiment, the lenses or optical elements 216 formed on the lens wafer 508 face away from the light-emitting die 504. As such, light emitted by the light-emitting die 504 travels through the lens wafer 508 and upward as shown in FIG. 5. In some embodiments, the lens wafer 508 can be produced using an imprint process at the wafer level to help create the various lens elements or optical elements 216 in the lens wafer 508.

Figure 6C:
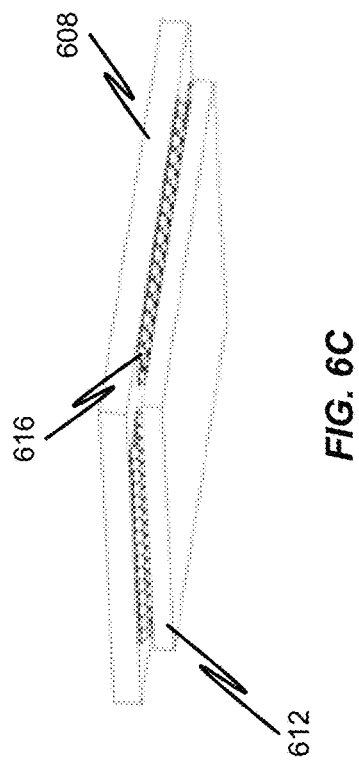
FIG. 6C is a second isometric view of the optical device from FIG. 6A.
Figure 6A:
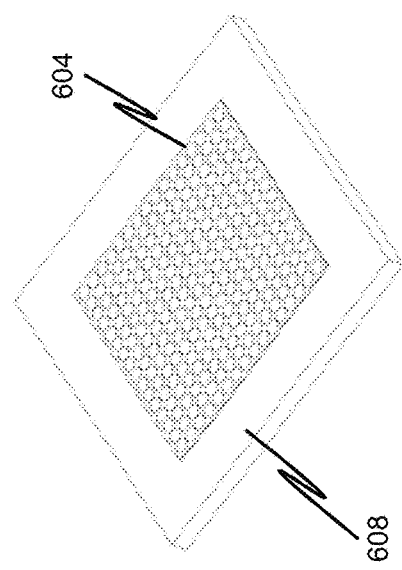
FIG. 6A is a top isometric view of another optical device in accordance with at least some embodiments of the present disclosure.
Figure 6B:
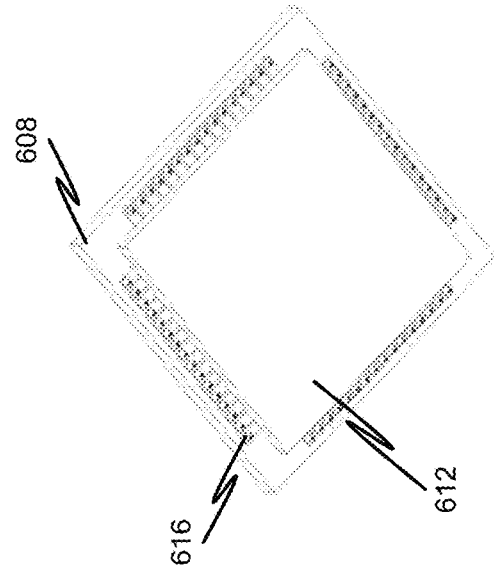
FIG. 6B is a bottom isometric view of the optical device from FIG. 6A.

Whereas wirebonding is one possible solution, it should be appreciated that the light-emitting die 504 can also be directly flip-chipped into a Quad Flat No Leads (QFN) package (or similar form factor) with through vias in the non-native substrate 404. Specifically, as shown in FIGS. 6A-C, the light-emitting die 612 may be flip-chip connected to the lens wafer 604 and then additional contacts for the cathode column-bus and anode row-bus can be exposed on the bottom side of a submount 608 that is connected with the light-emitting die 612 via solder balls 616. In some embodiments, the light-emitting die 612 can be similar or identical to the light-emitting die 504 and the lens wafer 604 may be similar to the lens wafer 508 except that the relative size of the components are different and the connection mechanisms between the components are different. In particular, the flip-chip example shows the light-emitting die 612 being smaller in area than a submount 608 to which the lens wafer 604 is connected. The submount 608 may provide the interconnectivity between the lens wafer 604 and light-emitting die 612. Thus, the lens wafer 604 may be attached to a first (e.g., top) surface of the submount 608 whereas the light-emitting die 612 is attached to an opposing second (e.g., bottom) surface of the submount 608. The connection between the light-emitting die 612 and submount 608 may be facilitated with a plurality of solder balls 616. Additionally, another plurality of solder balls 616 may be used to connect the metal strips of the light-emitting die 612 via solder pads provided on the bottom side of the submount 608. Thus, the bottom side of the submount 608 can be flip-chip connected to a PCB or the like and light emitted by the light-emitting die 612 can travel away from the substrate, away from the PCB, and through the lens wafer 604. In some embodiments, the area of the lens wafer 604 is smaller than the area of the submount 608 to enable the solder pads on the bottom of the submount to extend beyond the ends of the light-emitting die 612. In some embodiments, the submount is substantially transparent to any wavelength of light produced by the light-emitting die 612. As an example, the submount 608 may correspond to a glass or plastic material that is capable of having one or more electrical traces and/or bonding pads formed thereon to facilitate solder connectivity to a PCB or the like.

Figure 7B:
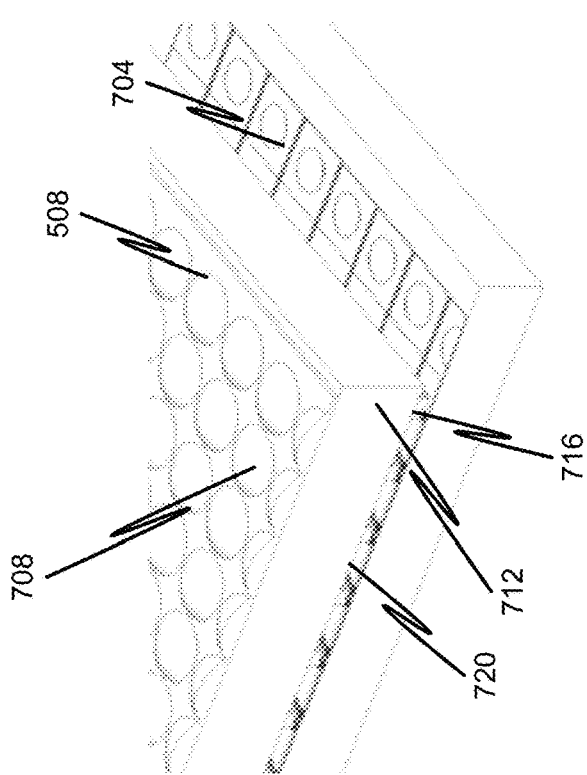
FIG. 7B is a detailed cross-sectional view from FIG. 7A.
Figure 7A:
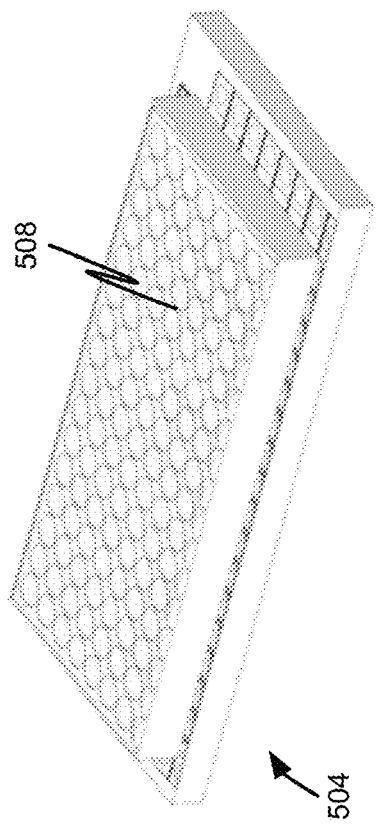
FIG. 7A is a cross-sectional view of the optical device from FIG. 5.
Figure 7C:
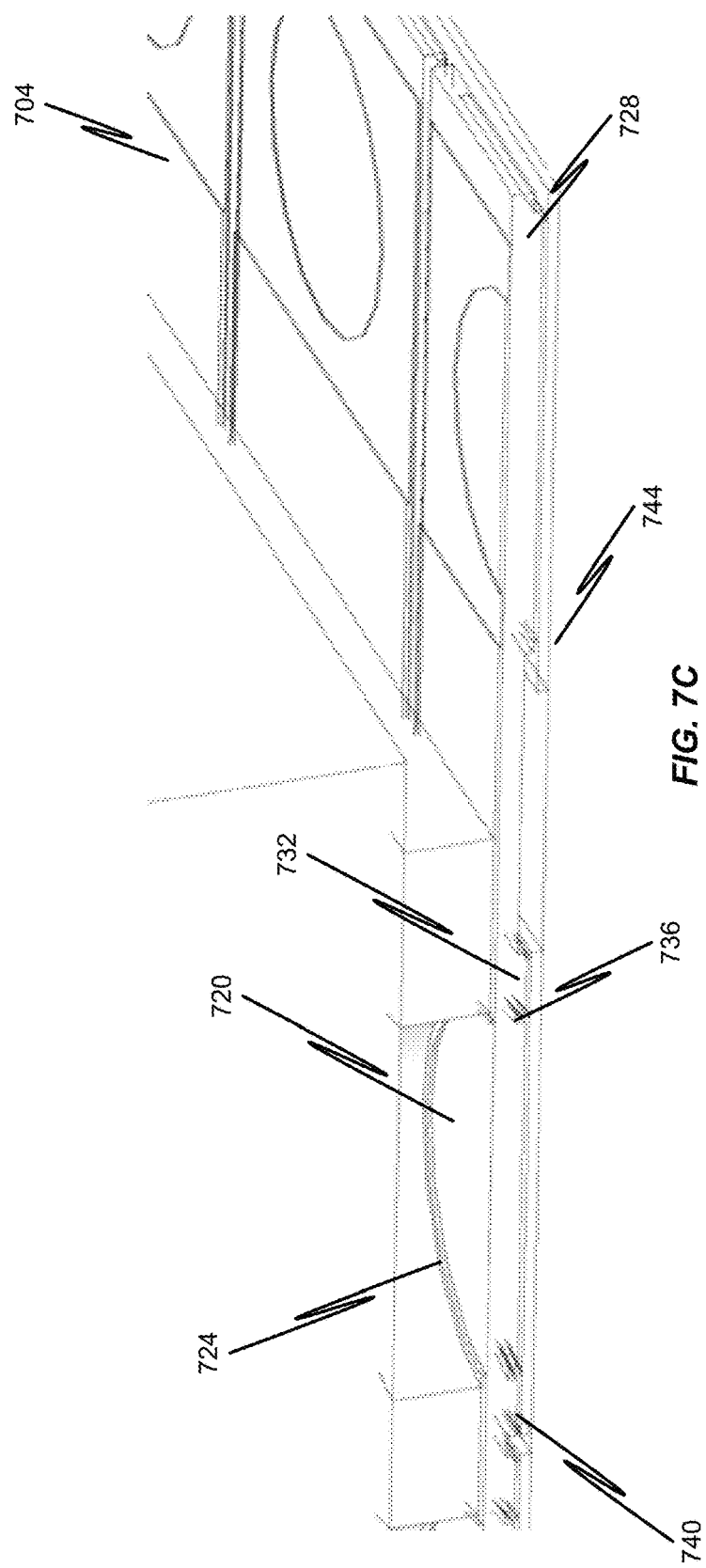
FIG. 7C is a further detailed cross-sectional view from FIG. 7B.

With reference now to FIGS. 7A-C, additional details of an optical device will be described in accordance with at least some embodiments of the present disclosure. The optical device depicted and described in FIGS. 7A-C may correspond to an example of the optical device depicted and described in FIG. 5 although it should be appreciated that minor modifications can be provided to the device of FIGS. 7A-C to accommodate the optical device of FIGS. 6A-C.

FIG. 7A again shows the light-emitting die 504 with a lens wafer 508 mounted thereon. FIG. 7A specifically shows a cross-sectional view of the optical device. FIGS. 7B-C depict additional details of the optical device and help provide an understanding of how the lens wafer 508 can be connected to the light-emitting die 504. In particular, the light-emitting die 504 is shown to include a substrate 744 and an epi layer 728 on which a grid of metal strips are provided. The grid of metal strips may include a plurality of n-metal strips and p-metal strips. The n-metal strips 724 may be connected to or extend out as part of the cathode column-bus 704. The p-metal strips 732 may be provided on the bottom side of the epi layer 728 and may overlap corresponding rows in an anode row-bus 740

In the depicted embodiment, the cathode column-bus 704 is provided on the first (e.g., top) surface of the epi layer 728 whereas the anode row-bus 740 is provided on the substrate 744, between the epi layer 728 and the substrate 744. The n-metal strips 724 in the cathode column-bus 704 may include a plurality of apertures 720, that are positioned over corresponding active regions in the epi layer 728. Each aperture 720 may be optically aligned (e.g., provided in an overlapping configuration) with a unique lens element 708 in the lens wafer 508. In some embodiments, each unique lens element 708 is formed in the lens wafer 508 using a wafer imprint process. The optical device may further include an optical spacer 712 and a second spacer 716 between the epi layer 728 and lens wafer 508. In some embodiments, the optical spacer 712 may include a polymer material that is transparent to light emitted by the active region in the epi layer 728. The second spacer 716 may provide an optional space that is used to further separate the lens wafer 508 from the cathode column-bus 704. The second spacer 716 may have a series of holes or void formed to surround a corresponding aperture 720.

As previously discussed, the cathode column-bus 704 may include a plurality of n-metal strips 724, each of which have a plurality of apertures 720 formed therein. Each aperture 720 in the n-metal strips 724 may overlap a corresponding active region in the epi layer 728. The apertures 720 in the n-metal strips 724 are configured to allow light to pass through toward the lens wafer 508. The opposite side of the epi layer 728 may have the p-metal strips 732 deposited thereon. The p-metal strips may extend transverse to the n-metal strips 724 on the opposing side of the epi layer 728. In some embodiments, the p-metal strips 732 are deposited on the epi layer 728 and then placed into contact with the anode row-bus 740, which is formed/deposited on the substrate 744. In some embodiments, the p-metal 732 may have a plurality of mesa structures formed thereon that are surrounded by trenches 736. A trench 736 and mesa structure may be provided for each of the active regions in the epi layer 728. The anode row-bus 740 may extend parallel with the p-metal 732 deposited on the epi layer 728, both of which are orthogonal to the cathode column-bus 704 and n-metal strips 724.

Figure 8B:
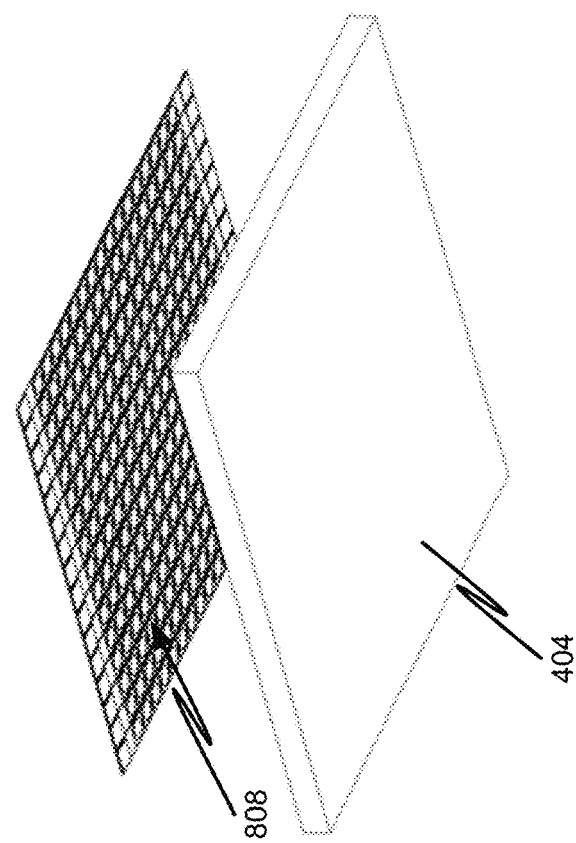
FIG. 8B is a bottom isometric view of the semiconductor die from FIG. 8A.
Figure 8A:
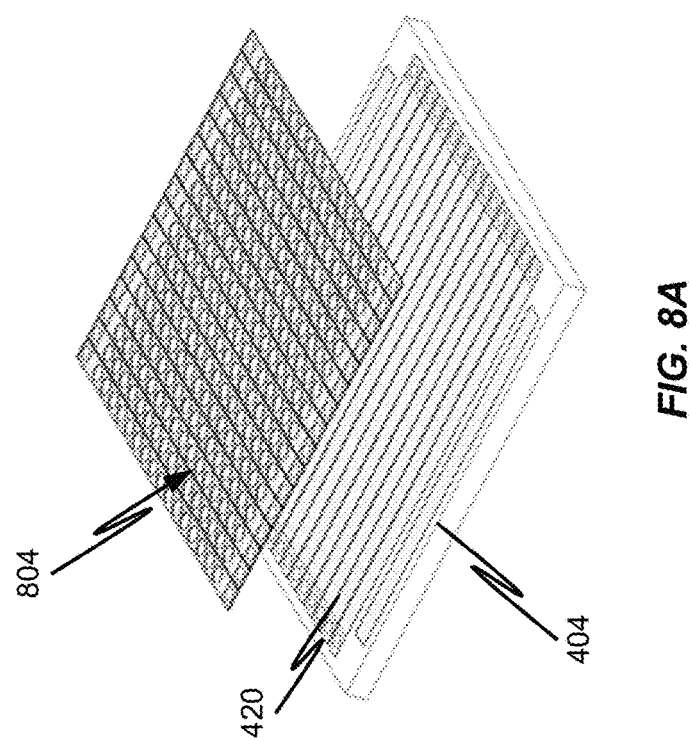
FIG. 8A is an exploded isometric view of a semiconductor die in accordance with at least some embodiments of the present disclosure.
Figure 9A:
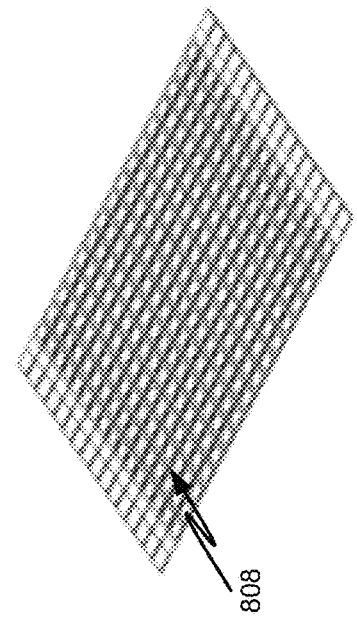
FIG. 9A is a top isometric view of a component of an optical device in accordance with at least some embodiments of the present disclosure.
Figure 9B:
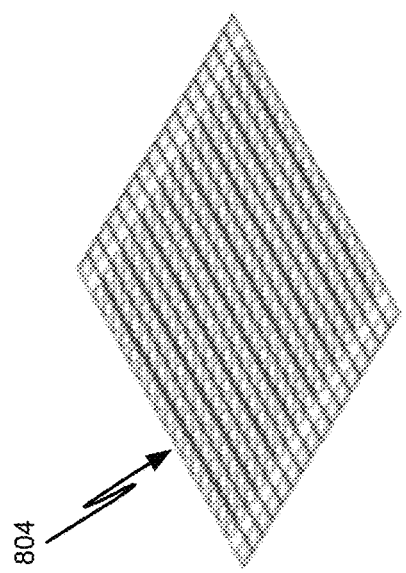
FIG. 9B is a bottom isometric view of the component from FIG. 9A.
Figure 9C:
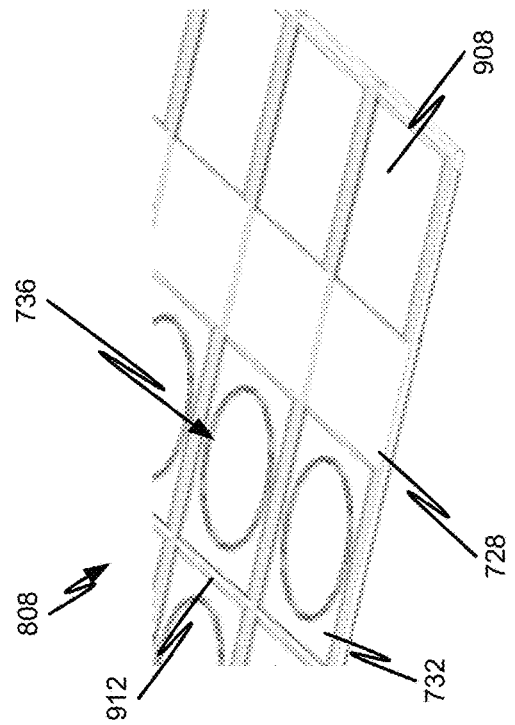
FIG. 9C is a detailed top isometric view of the component from FIG. 9A.
Figure 9D:
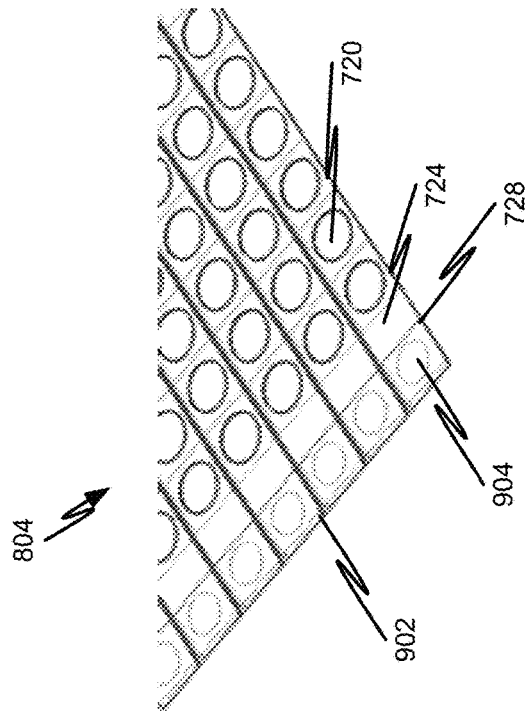
FIG. 9D is a detailed bottom isometric view of the component from FIG. 9A.

With reference now to FIGS. 8A-9D, additional details of an illustrative light-emitting die construction will be provided in accordance with at least some embodiments of the present disclosure. The optical device depicted in FIGS. 8A and 8B corresponds to an exploded view of a light-emitting die, such as light-emitting die 504 and/or light-emitting die 612. Each light-emitting die is shown to have an epi layer 728 with an n-contact side 804 and a p-contact side 808. The n-contact side 804 of the epi layer 728 is shown to face away from the substrate 404 whereas the p-contact side 808 of the epi layer 728 is shown to face toward the substrate 404. In some embodiments, the contacts of the p-metal 732 on the p-contact side 808 are arranged in a rectangular array. FIG. 9D shows metal contacts on 808 are squares with a circular trench. The metals are connected by 420 on the non-native substrate to form metal strips 732 that are substantially orthogonal to the metal strips of the n-contact side 804. The p-contact side 808 is shown to interface with the anode row-bus 420 provided on the top surface of the substrate 404. Each metal strip on the p-contact side 808 may be overlapped by a plurality of metal strips on the n-contact side 804, but not overlapped twice by the same metal strip on the n-contact side 804.

Additional details of the epi layer 728 will now be described in accordance with at least some embodiments of the present disclosure. It should be appreciated that the discussion of the epi layer 728 may refer to only the epi layer or other parts of the substrate in contact with the epi layer 728. For example, the layer 728 may be considered to include only an epi layer or layer 728 may have part of the original native substrate of GaAs material.

Again, the n-contact side 804 and p-contact side 808 are shown to be provided on opposing sides of the epi layer 728. Specific details of the n-contact side 804 are depicted in FIG. 9C where the top side of the epi layer 728 is shown with the plurality of n-metal strips 724 provided thereon. Each n-metal strip 724 is shown to have a plurality of apertures 720. One end of each n-metal strip 724 may have a corresponding bonding pad 904, which may facilitate electrical connectivity with the wirebonds and/or solder balls. In some embodiments, the substrate is isolated into bars along the column direction. The array correspond to a plurality of laser bars. There are two reason for this: Firstly, the n-side of the laser is connected in the semiconductor. The laser is, therefore, addressable in a row-column manner. This bar is used to separate the electrical connections into columns. The second reason for isolating the substrate into an array of laser bars is to position the p-side electrical contact on the other side. The contact is made on the metal of the non-native substrate. In order to get to the metal on the non-native substrate, the native substrate should be removed. The same process step that is used to isolate the laser into bars is used to etch away material so the p-side electrical contact can be exposed for electrical connection.

The p-contact side 808 is further depicted in FIG. 9D. As shown in FIG. 9D, the p-contact side 808 may include a plurality of p-metal strips 732 provided on the bottom side of the epi layer 728. Each p-metal strip 732 may have a plurality of trenches 736 distributed thereon. In some embodiments, an equal number of trenches 736 and apertures 720 are provided. Even more specifically, each trench 736 may be provided for a corresponding aperture 720 such that a particular trench 736 has a corresponding aperture 720 provided above it in the n-metal layer 724.

As shown in FIG. 8A, the metal on 404 is arranged in 16 strips of element 420. There are two extra strips on the outer edges which may be different from the other strips 420. For instance, these two outer-most strips 420 of metal may be positioned directly under pads 908. They are provided so the back side of 904 is mechanically supported. Each one of the strips 732 are electrically isolated from other adjacent strips 732. A row of strips 732 are connected by strips 420 on the non-native substrate. The pads 908 are also insulated, but they don't serve electrical function even though they are connected by the metal strips on the outer edges of the non-native substrate. Each trench 736 is also shown to have its surrounding p-metal isolated from the p-metal of adjacent trenches 736 by isolation gaps. In some embodiments, adjacent trenches 736 may be connectable to a common row in the anode row-bus 740 (and it should be appreciated that anode row-bus 740 is the same as or similar to element 420). The gaps help ensure that active regions contained within the trenches 736 are independently addressable and capable of being activated without inadvertently activating other active regions. The gaps may be created by etching away the metal 732 between adjacent trenches 736.

With reference now to FIGS. 10A-D, a process for constructing an optical device 1020 will be described in accordance with at least some embodiments of the present disclosure. The optical device 1020 depicted and described in connection with FIGS. 10A-D may not necessarily be identical to the optical device depicted and described in connection with FIGS. 5 and 7A-C, but may have similarities therewith.

A first exploded view of the components used to construct the optical device 1020 is provided in FIG. 10A. The components of the optical device 1020 include, for instance, a die 1004, which may be a VCSEL die or similar type of light-emitting semiconductor die package, a first set of solder balls 1008, an interposer 1012, and a second set of solder balls 1016. As shown in FIG. 10B, the first set of solder balls 1008 may be attached or otherwise connected to the die 1004. In some embodiments, the first set of solder balls 1008 are provided at the contact pads of the p-metal strips and n-metal strips, which form the metal grid on the substrate of the die 1004. As shown in FIG. 10C, the interposer 1012 may then be attached onto the die 1004 by a self-alignment reflow process. In particular, the interposer 1012 may have a plurality of contacts provided on its bottom surface that can be connected to the first set of solder balls 1008. In this example, the interposer 1012 is further shown to include the lens wafer on its top side (e.g., a side opposing the die 1004). In FIG. 10D, the device 1020 is shown as being fully constructed when the second set of solder balls 1016 are attached, placed, or otherwise connected to the top of the interposer 1012. At this point, the optical device 1020 may be ready for connection with an external circuit to become part of a larger optical system.

With reference now to FIGS. 11A-D, a process for constructing another optical device 1120 will be described in accordance with at least some embodiments of the present disclosure. The optical device 1120 depicted and described in connection with FIGS. 11A-D may or may not necessarily be identical to the optical device depicted and described in connection with FIGS. 6A-C. It should be appreciated, however, that optical device 1120 may also have similarities to other optical devices depicted and described herein.

Figure 11A:
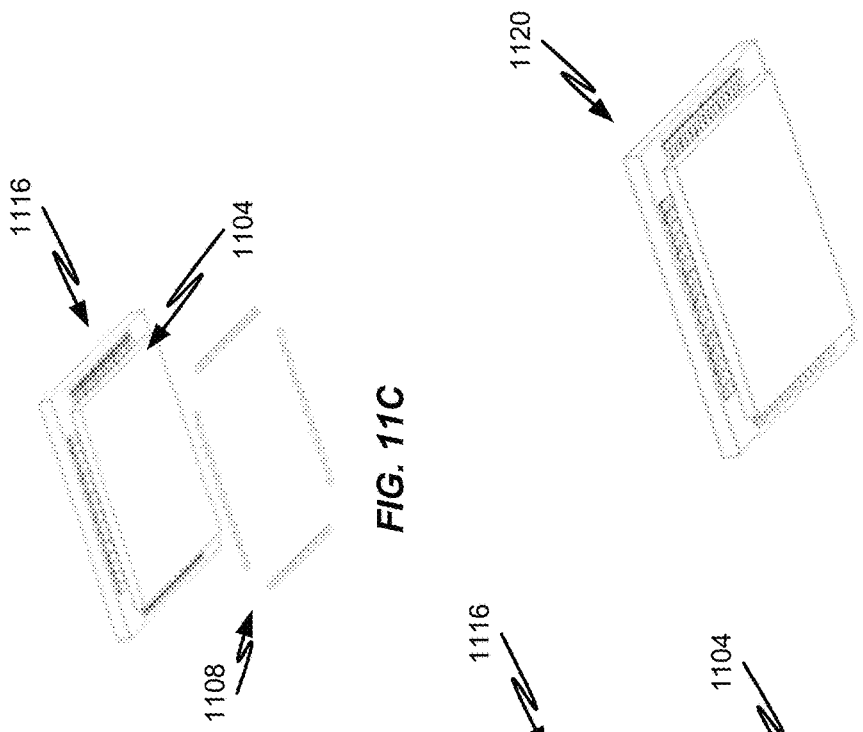
FIG. 11A is a first exploded view of another optical device in accordance with at least some embodiments of the present disclosure.
Figure 11B:
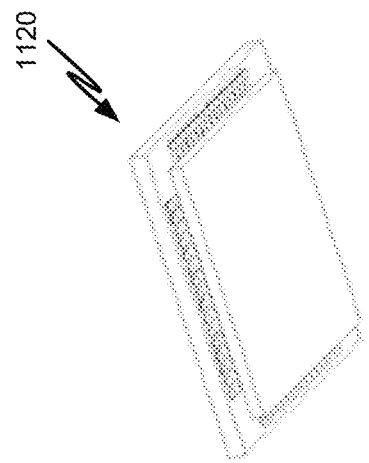
FIG. 11B is a second exploded view of the optical device from FIG. 11A.
Figure 11C:
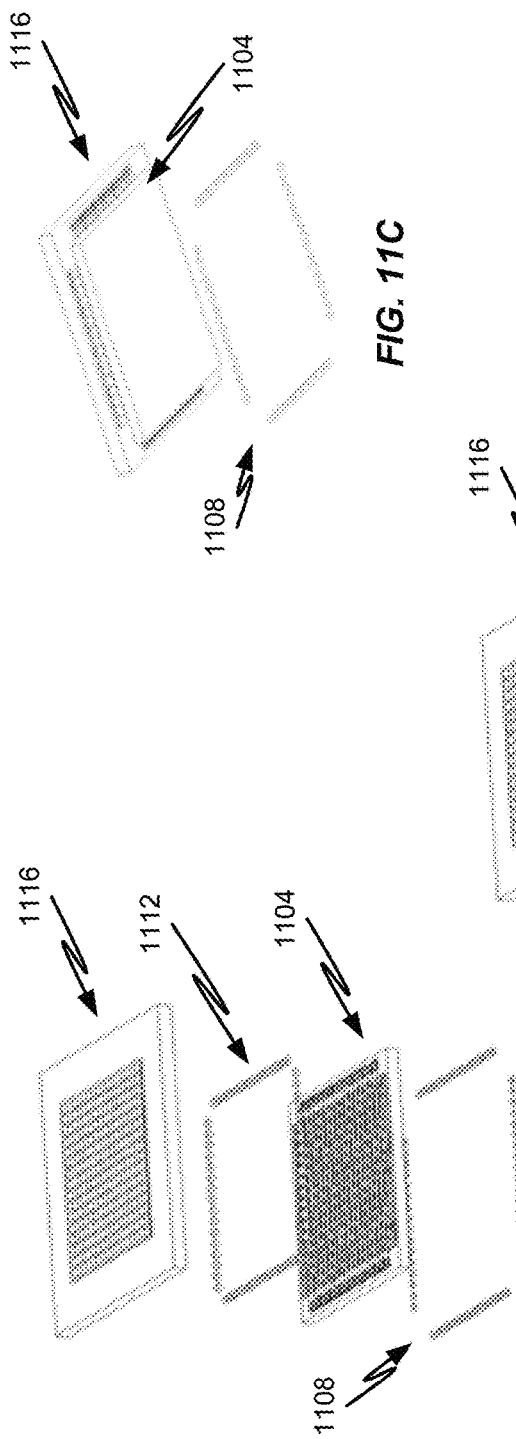
FIG. 11C is a third exploded view of the optical device from FIG. 11A.
Figure 11D:
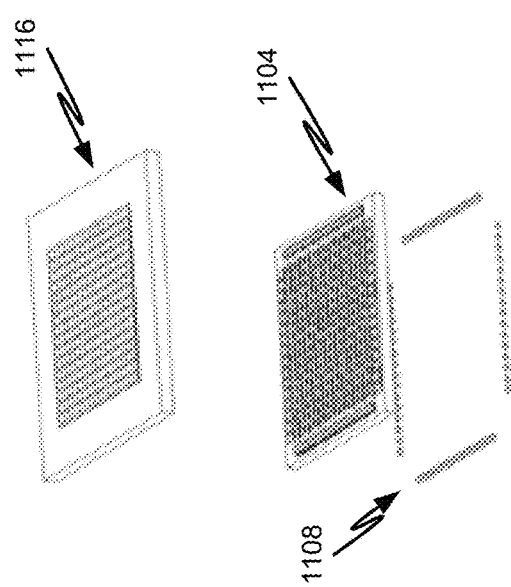
FIG. 11D is an isometric view of the fully-constructed optical device from FIG. 11A.

A first exploded view of the components used to construct the optical device 1120 is provided in FIG. 11A. The components of the optical device 1120 include, for instance, a die 1104, a first set of solder balls 1108, a second set of solder balls 1112, and an interposer 1116. As shown in FIG. 11B, the second set of solder balls 1112 are first attached to the top side of the die 1104. In some embodiments, the solder balls are provided at the contact pads of the p-metal strips and n-metal strips, which form the metal grid on the substrate of the die 1104. As shown in FIG. 11C, the interposer 1116 may then be attached onto the die 1104 by a self-alignment reflow process. Specifically, the interposer 1116 may have a plurality of contacts provided on its bottom surface that can be connected to the second set of solder balls 1112. In FIG. 11D, the device 1120 is shown as being fully constructed when the first set of solder balls 1108 are attached, placed, or otherwise connected to the bottom of the interposer 1116. The optical device 1120 is then ready for connection with an external circuit to become part of a larger optical system.

Figure 12:
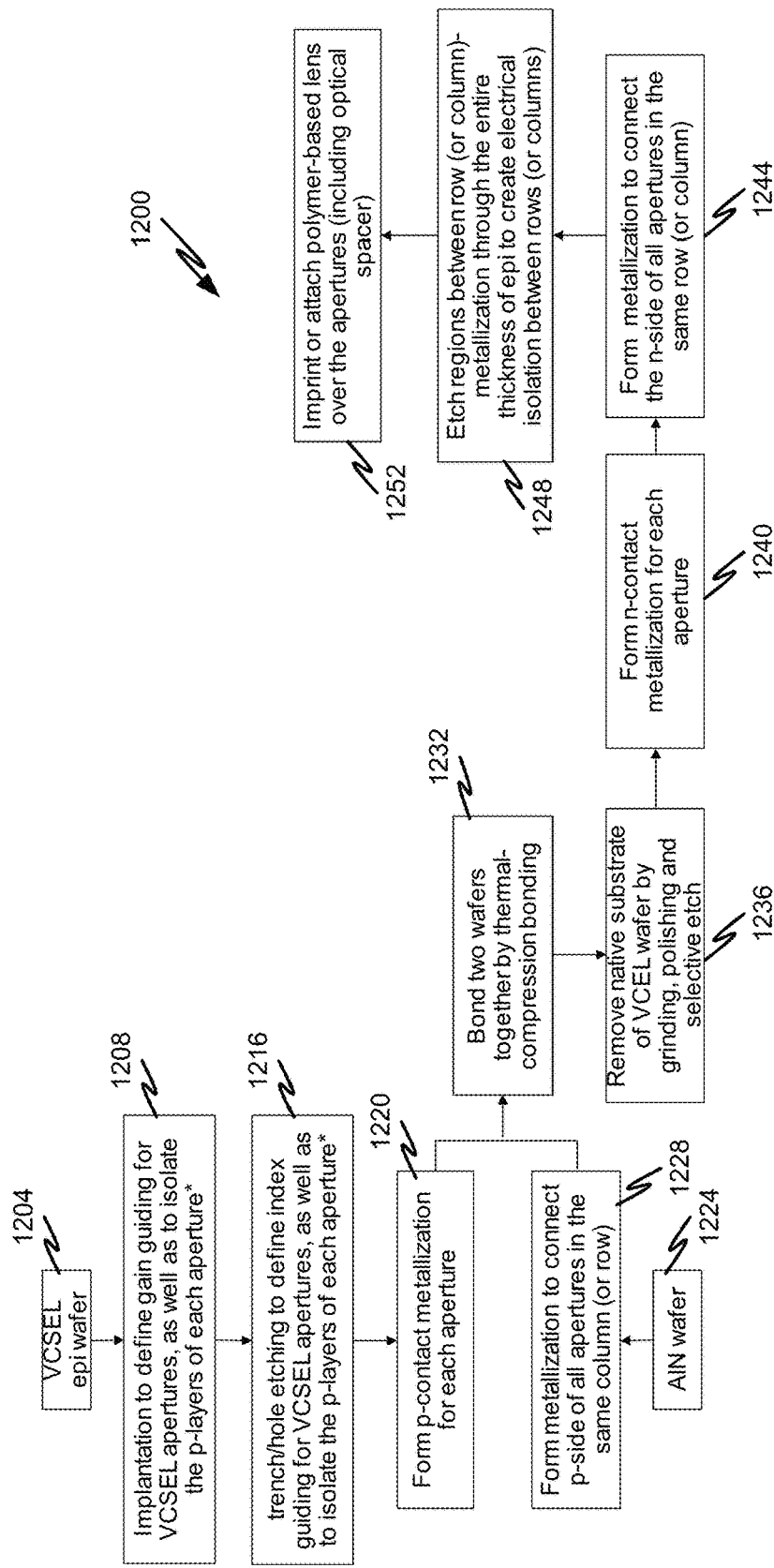
FIG. 12 is a flow diagram depicting a method of constructing an optical device in accordance with at least some embodiments of the present disclosure.

With reference now to FIG. 12, a method 1200 of constructing an optical device will be described in accordance with at least some embodiments of the present disclosure. It should be appreciated that the method 1200 may be used to construct any optical device or components of an optical device depicted and described herein without departing from the scope of the present disclosure. The method 1200 begins with the receipt of an epi wafer (step 1204). In some embodiments, the wafer corresponds to a VCSEL wafer. The method 1200 continues with an implantation, etching, and isolation step or series of steps (steps 1208 and 1216). The sequence of steps 1208 and 1216 can be interchanged in accordance with at least some embodiments of the present disclosure. Step 1208 may include performing an implantation to define gain guiding for the VCSEL apertures in the n-metal strips as well as to isolate the p-layers of each aperture. Step 1216 may include trench or hole etching to define the index guiding for VCSEL apertures as well as to isolate the p-layers for each aperture.

The method 1200 continues by forming the p-contact metallization 912 for each aperture on the epi layer (step 1220). Before, after, or simultaneous with step 1220 (and prior steps), the non-native substrate wafer may also be received (step 1224) and processed (step 1228). In particular, the non-native substrate may have metallization formed thereon to connect the p-side of all apertures to the same column-bus (or row-bus as appropriate) (step 1128).

The method 1200 further continues by bonding the two wafers (e.g., the non-native substrate and the epi wafer together (step 1232). In some embodiments, the wafers are bonded together using a thermal-compression bonding technique or any other known wafer-bonding technique. Thereafter, the native substrate of the epi wafer is removed (partially or completely) by grinding, polishing, and/or selective etching (step 1236). Once the native substrate of the epi wafer has been removed, the n-contact metallization for each aperture is formed on the top side of the epi wafer (step 1240).

The method 1200 then continues by forming metallization to connect the n-metal strips of all apertures to the same row-bus (or column-bus as appropriate) (step 1244). Thereafter, regions between the column-metallization are etched through the entire thickness of the epi wafer to create an electrical isolation between the columns (step 1248). In some embodiments, this step of the process corresponds to a step where the gaps 902 are created. The method 1200 then includes an additional, but optional, step of imprinting or attaching a polymer-based lens or lens wafer over the apertures (step 1252). In some embodiments, it may be better to mount a lens on the device. Normally, for a lens to be effective, it needs to have a distance from the light source. The optical distance from the active area of the VCSEL to the backside is very short. This is for a higher degree of integration. This step may also include the optional step of providing an optional spacer between the lens wafer and epi wafer.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. An optical device, comprising:
a semiconductor layer having a first surface and a second surface opposing the first surface, the semiconductor layer comprising a plurality of active regions;

a plurality of first metal strips positioned adjacent to the first surface, each of the plurality of first metal strips being in a substantially parallel arrangement and oriented in a first direction;

a plurality of apertures positioned on the plurality of first metal strips; and a plurality of second metal strips positioned adjacent to the second surface, each of the plurality of second metal strips being in a substantially parallel arrangement and oriented in a second direction that forms an angle relative to the first direction, wherein each of the plurality of active regions are positioned at an intersection residing between a metal strip in the plurality of first metal strips and a metal strip in the plurality of second metal strips, and wherein the plurality of active regions are positioned in correspondence with the plurality of apertures, respectively, such that the plurality of active regions are adaptable to emit light independently through a corresponding aperture.

2. The optical device of claim 1 further comprising a non-native substrate positioned adjacent to the second surface of the semiconductor layer, wherein the plurality of second metal strips are disposed on the non-native substrate, and wherein the non-native substrate comprises at least one of an $Al_2O_3$, AlN, SiC or Si substrate.

3. The optical device of claim 1, wherein the second metal strips are arranged orthogonal to the plurality of first metal strips.

4. The optical device of claim 1, wherein the semiconductor layer comprises a plurality of mesa structures positioned adjacent to the plurality of apertures, respectively, and wherein the plurality of active regions are situated adjacent to the plurality of mesa structures, respectively, such that the plurality of mesa structures are optically coupled to the plurality of active regions.

5. The optical device of claim 4, wherein each of the plurality of active regions is configured to generate a spatial coherent light beam that emits from the corresponding aperture and wherein the semiconductor layer comprises a plurality of trench structures defining the plurality of mesa structures.

6. The optical device of claim 3, wherein the semiconductor layer comprises a plurality of electrically isolated regions surrounding the plurality of active regions, respectively, such that each of the plurality of active regions can be selected to emit light independent of the others of the plurality of active regions, and wherein a corresponding mesa structure in conjunction with a corresponding electrically isolated region surrounding the corresponding mesa structure guides the light to emit through a corresponding aperture towards a confined direction.

7. The optical device of claim 1 further comprising:

a plurality of lens structures, wherein each of the plurality of lens structures is arranged corresponding to the plurality of apertures; and an optical spacer layer adjacent to the first surface of the semiconductor layer, wherein the plurality of lens structures are disposed on a first surface of the optical spacer layer, wherein the optical spacer layer further comprises a second surface opposing the first surface, and wherein the plurality of lens structures are situated on the second surface and distanced away from the plurality of apertures.

8. The optical device of claim 1, wherein the semiconductor layer comprises an epitaxial layer having a front surface and a back surface that is opposing the front surface, wherein the plurality of active regions are positioned near the front surface, and wherein the plurality of first metal strips are positioned on the back surface.

9. The optical device of claim 1, wherein when one of the plurality of active regions is adapted to emit light, an electric current flows through the one of the plurality of active regions in a third direction that is orthogonal to the first and second directions.

10. The optical device of claim 1, wherein each of the plurality of active regions comprises a cathode terminal and an anode terminal, wherein each of the plurality of active regions is configured to emit light when the anode terminal is coupled to a first voltage and the cathode terminal is coupled to a second voltage that is lower than the first voltage, wherein the plurality of first metal strips are electrically coupled to one of the anode terminals of each of the plurality of active regions, and wherein the plurality of second metal strips are electrically coupled to one of the cathode terminals of each of the plurality of active regions.

11. The optical device of claim 1, wherein when the optical device is configured not to emit light in an OFF-state, all of the plurality of first metal strips and all of the plurality of second metal strips are biased at a TURN-OFF current level such that the plurality of active regions are biased below the light-emitting threshold current so as not to emit light.

12. The optical device of claim 1, wherein when the optical device is configured such that only one of the plurality of active regions is to emit light, a corresponding second metal strip and a corresponding first metal strip that are electrically coupled to the one of the plurality of active regions pass a current above the light-emitting threshold of the one active region, and wherein the other second metal strips and the other first metal strips draw either no current or a current below the light-emitting threshold.

13. The optical device of claim 1, wherein the plurality of first metal strips are electrically connected to the plurality of active regions respectively without a matrix switch.

14. The optical device of claim 1, wherein the plurality of second metal strips are electrically connected to the plurality of active regions respectively without a matrix switch.

15. The optical device of claim 1, wherein the optical device comprises a vertical cavity surface-emitting laser (VCSEL).

16. The optical device of claim 1, wherein the active regions are arranged in a rectangular array.

17. An optical system, comprising:

a semiconductor layer;

a first metal strip positioned adjacent to a first surface of the semiconductor layer, wherein the first metal strip comprises a first aperture that is positioned adjacent to a first active region in the semiconductor layer, and wherein the first metal strip comprises a second aperture that is positioned adjacent to a second active region in the semiconductor layer;

a second metal strip positioned adjacent to a second surface of the semiconductor layer that opposes the first surface of the semiconductor layer, wherein the second metal strip overlaps the first metal strip in proximity with the first active region and not the second active region; and a third metal strip positioned adjacent to the second surface of the semiconductor layer, wherein the third metal strip is oriented substantially parallel with the second metal strip, and wherein the third metal strip overlaps the first metal strip in proximity with the second active region and not the first active region.

18. The optical system of claim 17, wherein the first active region and second active region are independently addressable and configured to emit light in response to a selective application of a voltage to the second metal strip and third metal strip, wherein light emitted by the first active region passes through the first aperture, wherein light emitted by the second active region passes through the second aperture, wherein the semiconductor layer comprises a first mesa structure positioned adjacent to the first aperture and a second mesa structure positioned adjacent to the second aperture, wherein the first mesa structure is optically coupled to the first active region, and wherein the second mesa structure is optically coupled to the second active region.

19. The optical system of claim 17, wherein the second metal strip and third metal strip reside in a common plane, wherein the first metal strip resides in a second plane that is substantially parallel with the common plane, and wherein a distance between the first active region and the second active region substantially corresponds to a distance between the second metal strip and the third metal strip.

20. An optical device comprising:
 a plurality of light emitting components arranged in a two-dimensional manner, each of the light emitting components comprising:
  a substrate,
  a semiconductor layer having a first surface and a second surface, wherein the first surface faces toward the substrate,
  an active region of the semiconductor layer disposed adjacent to the first surface,
  an optical structure layer disposed on the second surface of the semiconductor layer, wherein the optical structure layer comprises a lens structure,
  a first metal layer sandwiched between the optical structure layer and the semiconductor layer,
  a second metal layer sandwiched between the semiconductor layer and substrate, and
  an aperture positioned on the first metal layer, wherein the lens structure, the aperture and the active region are optically coupled to each other such that an optical radiation emitted from the active region is directed through the aperture towards the lens structure;
 a plurality of first metal structures, wherein the first metal layer belongs to the plurality of first metal structures; and
 a plurality of second metal structures, wherein the second metal layer belongs to the plurality of second metal structures,
 wherein the plurality of light emitting components are independently addressable through selective biasing of the plurality of first metal structures and the plurality of second metal structures.

* * * * *